United States Patent
Camm et al.

(10) Patent No.: US 7,184,657 B1
(45) Date of Patent: Feb. 27, 2007

(54) ENHANCED RAPID THERMAL PROCESSING APPARATUS AND METHOD

(75) Inventors: Dave Camm, Vancouver (CA); Mike Krasnich, Richmond (CA); Miaden Bumbulovic, Vancouver (CA); Sergiy Dets, Richmond (CA); Steve McCoy, Buraby (CA)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 11/228,964

(22) Filed: Sep. 17, 2005

(51) Int. Cl.
*A21B 2/00* (2006.01)
*C23C 16/00* (2006.01)

(52) U.S. Cl. ...................... 392/418; 118/724
(58) Field of Classification Search ............. 392/416, 392/417, 418; 118/724, 725
See application file for complete search history.

(56) References Cited

U.S. PATENT DOCUMENTS

| | | | |
|---|---|---|---|
| 4,560,420 A | 12/1985 | Lord | |
| 4,818,327 A | 4/1989 | Davis et al. | |
| 4,857,689 A | 8/1989 | Lee | |
| 4,981,815 A | 1/1991 | Kakoschke | |
| 5,399,523 A | 3/1995 | Kakoschke | |
| 5,467,220 A | 11/1995 | Xu | |
| 5,848,889 A * | 12/1998 | Tietz et al. | 432/258 |
| 6,072,163 A * | 6/2000 | Armstrong et al. | 219/497 |
| 6,188,838 B1 * | 2/2001 | Mikata et al. | 392/418 |
| 6,222,990 B1 | 4/2001 | Guardado et al. | |
| 6,303,411 B1 | 10/2001 | Camm et al. | |
| 6,529,686 B2 * | 3/2003 | Ramanan et al. | 392/418 |
| 6,594,446 B2 | 7/2003 | Camm et al. | |
| 6,610,968 B1 | 8/2003 | Shajii et al. | |
| 6,621,199 B1 | 9/2003 | Parfeniuk et al. | |
| 6,717,158 B1 | 4/2004 | Gat et al. | |
| 6,849,831 B2 | 2/2005 | Timans et al. | |
| 2002/0102098 A1 | 8/2002 | Camm et al. | |
| 2004/0105670 A1 * | 6/2004 | Kusuda et al. | 392/418 |
| 2004/0178553 A1 | 9/2004 | Camm et al. | |
| 2005/0063453 A1 | 3/2005 | Camm et al. | |
| 2005/0133167 A1 | 6/2005 | Camm et al. | |
| 2005/0179354 A1 | 8/2005 | Camm et al. | |

\* cited by examiner

*Primary Examiner*—Daniel Robinson
(74) *Attorney, Agent, or Firm*—Pritzkau Patent Group, LLC

(57) ABSTRACT

A heating arrangement heats a first major surface of a workpiece with an illumination energy such that a first portion of the illumination energy is directly incident upon the first major surface of the workpiece and a second portion of the illumination energy is directed such that, at least initially, the second portion would miss the first major surface. A reflector, having a central opening, reflects at least some of the second portion of the illumination energy onto the peripheral edge region of the workpiece for preheating compensation. The reflector is configured for shadow-free exposure of a second, opposing major surface of the workpiece to a flash heating energy. A workpiece manipulation arrangement is described to provide for dynamic preheating movement to vary a heating profile across the workpiece and, thereafter, move the workpiece to a flash heating position. Automatic workpiece centering is featured by the manipulation arrangement.

33 Claims, 9 Drawing Sheets

ENHANCED RAPID THERMAL PROCESSING APPARATUS AND METHOD

BACKGROUND OF THE INVENTION

The present invention is generally related to the field of Rapid Thermal Processing and, more particularly, to techniques and apparatus for enhancing uniformity in Rapid Thermal Processing.

The prior art has developed a number of approaches in the use of Rapid Thermal Processing (RTP) for purposes of producing state-of-the-art devices. Such devices include, for example, semiconductor chips, solar cells and nanoparticle materials. RTP has been found to be particularly useful following ion implantation processes applied to a substrate or workpiece, in which the implanted dopant atoms are left in interstitial sites where they are electrically inactive. RTP is applied with the intention of repairing the damage to the crystal lattice structure and to move dopants to lattice sites to electrically activate these dopants.

One form of RTP essentially uses isothermal heating in which radiant energy is applied for a time duration and at a cooperating intensity so as to cause the temperature of the workpiece to rise at least approximately uniformly throughout the bulk of the workpiece thickness. Thus, this form of isothermal RTP may be referred to as "isothermal RTP" and is generally characterized by treatment time durations on the order of seconds.

As device sizes and junction depths have progressively decreased with successive generations, difficulties have come to light with respect to the use of isothermal RTP. In particular, at the high temperatures that cause the desired dopant activation, it has been found that diffusion mechanisms come into play which cause the dopant impurities and other species to diffuse from their intended positions within the overall device structure. Such diffusion can result in impaired functionality of the device, in view of reduced feature sizes.

Concern with respect to undesired diffusion effects has motivated the development of what may be referred to as millisecond or flash RTP. This more recent approach to RTP is characterized by heating the workpiece in a way that deliberately produces a temperature gradient through the thickness of the wafer or workpiece. One highly advantageous approach is described in U.S. Pat. No. 6,594,446 entitled HEAT TREATING METHODS AND SYSTEMS, which is incorporated herein by reference in its entirety. The time duration, for purposes of millisecond RTP, is from 0.1 ms to 20 ms. The premise of millisecond RTP resides in flash heating the device side of the workpiece briefly so that the bulk of the workpiece remains cooler. In this way, the bulk of the workpieces acts as a heat sink, following flash heating of the device side of the workpiece. Such an implementation is effective when the time period of the flash heating is considerably faster than the thermal conduction time of the workpiece.

Thus, millisecond RTP reduces dopant diffusion by limiting both the time at which temperature is sufficiently high to enable diffusion, in conjunction with limiting the volume of workpiece that is heated to such high temperature. Of course, pulsed RTP may be used in what may be considered as a hybrid form with isothermal RTP, for example, by heating the workpiece to an intermediate temperature and then applying pulsed energy as is taught in U.S. Pat. No. 6,849,831 which is incorporated herein by reference.

In addition to the aforedescribed difference with respect to diffusion effects, each form of RTP introduces other unique problems and opportunities with respect to its application. For example, with respect to isothermal RTP, heating uniformity is a concern, particularly for the reason that peripheral edges of the workpiece tend to lose energy more rapidly than the central portion of the workpiece. The edge region, therefore, tends to remain cooler than the center of the workpiece. As an example with respect to millisecond RTP, surface heating is intended to be essentially instantaneous. Therefore, pulse parameters must be carefully determined in advance to produce an intended result and there is generally no opportunity to influence the process result, once the pulse has been initiated. In contrast, it is recognized that edge cooling, in millisecond RTP, is generally of limited concern, since heating rates are generally extremely high in comparison with the rates of radiative losses or conduction and convection heat losses from the workpiece to the ambient gas in the treatment chamber.

With the foregoing in mind, U.S. Pat. No. 4,981,815 (hereinafter the '815 patent) provides one example of isothermal RTP which attempts to resolve the problem of edge cooling. In one approach, that is illustrated by FIG. 7 of the '815 patent, a heating arrangement is used that employs one heat source in a confronting relationship with a major surface of the workpiece and another, separate heat source in a confronting relationship with the peripheral edge of the workpiece. It is submitted that this approach may be unduly complex in its need for an additional heat source that requires precision control. As one alternative, FIG. 6 of the '815 patent illustrates a reflector that is situated around the peripheral edge of the workpiece for returning thermal energy that is radiated from the peripheral edge of the workpiece. In this regard, it is of note that the prior art contains many examples based on reflecting thermal energy that is radiated from the workpiece back to its peripheral edge. It is considered that this approach is generally problematic for the reason that the radiated energy that is returned is simply not sufficient to compensate for the edge cooling effect caused by a combination of radiative, conductive and convective heat loss.

Another isothermal RTP approach is illustrated by FIG. 10 of the '815 patent, which uses a heating arrangement in a confronting relationship with a major surface of the workpiece, housed within a reflective box. The workpiece is movably positioned on support pins relative to a bottom wall of the reflective box such that varying the height of the workpiece, relative to the bottom reflective wall, allows a varying amount of reflected heat source energy to reach the bottom, peripheral edge region of the workpiece. FIG. 11 of the '815 patent illustrates yet another approach to isothermal RTP which is related to the approach of FIG. 10 of the patent at least to the extent that the workpiece is supported for movement on support posts. This movement is assertedly used to vary heating of the workpiece edges during the heating interval. Applicants recognize that these support posts, unfortunately, in isothermal RTP, will generally produce cold spots on the opposing surface of the workpiece. The patent, however, does not address this problem, as will be further discussed at an appropriate point below. Further, the reflective surface extends under the wafer and it is considered that this reflector would interfere with a double-sided heating implementation.

U.S. Pat. No. 4,560,420, issued to Lord, includes one embodiment that is deemed as suitable for rapid thermal annealing, illustrated in FIG. 5 of the Lord patent. This figure illustrates a raised reflective ring that is formed in the oven floor and situated directly under the peripheral edge of the workpiece. The perimeter wall of the reflective ring is made diffusely reflective while the interior, raised surface, that is surrounded by the reflective ring, receives a heat-absorptive black coating. Assertedly, the interior raised region cools the central portion of the workpiece with the intention of reducing temperature variations across the wafer. Other embodiments disclosed by Lord in FIGS. 2–4 of the patent are described as being prone to thermal cycling during heating. Hence, it is submitted that they are not well-suited for use in RTP processes, since these configurations will absorb energy from the heating arrangement and continue to reradiate thermal energy onto the workpiece edge, even after the heating arrangement is shut down. More particularly, the embodiment of FIG. 2 relies exclusively on the mechanism of returning thermal energy, that is radiated therefrom, to the workpiece edge, in conjunction with the mechanism of reradiating heat source energy. The latter mechanism is performed by absorbing energy from the heating arrangement, using at least one surface that is parallel with the major surfaces of the workpiece, and reradiating this energy from a surface that is in a confronting relationship with the peripheral edge of the workpiece. That is, there is no mechanism for producing reflection of the heat source energy onto the peripheral edge of the workpiece.

Still considering the Lord patent, it is of interest to note that the embodiments of FIGS. 3–5 are inherently limited to use in single sided workpiece heating configurations. That is, the reflector/radiator structures that are shown are opaque and located directly underneath the peripheral edge of the workpiece. Such structures would introduce problematic shadowing if any attempt were made to illuminate the bottom surface of the workpiece, as illustrated in the views of these figures.

The present invention is considered to resolve the foregoing difficulties and concerns while providing still further advantages.

SUMMARY OF THE INVENTION

An apparatus for processing at least one workpiece and associated method are described. The workpiece includes opposing first and second major surfaces surrounded by a peripheral edge which defines a workpiece diameter such that the first and second opposing surfaces cooperate with the peripheral edge to define a peripheral edge region. In one aspect of the present invention, the workpiece is received in a chamber interior of a processing chamber. A heating arrangement is in thermal communication with the chamber interior and in a confronting relationship with the first major surface for emitting an illumination energy such that a first portion of the illumination energy is directly incident upon the first major surface of the workpiece and a second portion of the illumination energy is directed such that, at least initially, the second portion would miss the first major surface. A reflector is supported in the chamber interior having an at least generally annular configuration thereby defining a central opening with an opening width, for any given measurement thereof, that is greater than the workpiece diameter, and the reflector is arranged, at least generally, in a concentric relationship with the peripheral edge and configured for reflecting at least some of the second portion of the illumination energy onto the peripheral edge region of the workpiece.

In another aspect of the present invention, an apparatus and associated method are described for heat treating at least one generally planar workpiece having opposing first and second major surfaces surrounded by a peripheral edge configuration such that the first and second opposing surfaces cooperate with the peripheral edge configuration to define a peripheral edge region. The workpiece is received in a chamber interior that is defined by a processing chamber. A heating arrangement is in thermal communication with the chamber interior and in a confronting relationship with the first major surface for emitting an illumination energy such that a first portion of the illumination energy is directly incident upon the first major surface of the workpiece and a second portion of the illumination energy is directed such that, at least initially, the second portion would miss the first major surface. A reflector arrangement, supported in the chamber interior, includes a shape that is complementary with respect to the peripheral edge configuration of the workpiece so as to define a complementary reflector configuration with the reflector arrangement, and the workpiece being mutually supported in a way which aligns the complementary reflector configuration with the peripheral edge configuration of the workpiece in a spaced-apart relationship therewith for causing at least part of the second portion of the illumination energy to be reflected by the complementary reflector configuration and to, thereafter, be incident around and onto the peripheral edge region of the workpiece and a projection, of at least the complementary reflector configuration onto a plane which includes the first major surface, is complementary to and outwardly spaced away from the peripheral edge configuration by at least a predetermined distance.

In still another aspect of the present invention, an apparatus and associated method are described for heat treating at least one wafer-shaped workpiece having opposing first and second major surfaces delimited by a peripheral edge. The workpiece is received in a chamber interior that is defined by a processing chamber. A first heating arrangement is in thermal communication with the chamber interior in a confronting relationship with the first major surface for emitting a first illumination energy during a first heating mode, at least a first portion of which first illumination energy is directly incident on the first major surface. A second heating arrangement is in thermal communication with the chamber interior in a confronting relationship with the second major surface and, in cooperation with emitting the first illumination energy, for emitting a second illumination energy that is directly incident on the second major surface, during a second heating mode. A reflector, supported in the chamber interior, includes an annular configuration for reflecting a second portion of the first illumination energy, that would otherwise at least initially miss the first major surface, so as to be surroundingly incident on a peripheral edge region of the workpiece, proximate to the peripheral edge, and providing for a substantially shadow-free illumination of the second major surface by the second illumination energy at least during the second heating mode.

In yet another aspect of the present invention, an apparatus and associated method are described for heat treating at least one wafer-shaped workpiece having opposing first and second major surfaces surrounded by a peripheral edge. The workpiece is received in a chamber interior that is defined by a processing chamber. A first heating arrangement is in thermal communication with the chamber interior for emitting a first illumination energy in a confronting relationship with the first major surface during a first heating mode, a first portion of which first illumination energy is directly incident on the first major surface and a second portion of which, at least initially, would miss the first major surface. A second heating arrangement is in thermal communication with the chamber interior in a confronting relationship with the second major surface and, in cooperation with emitting the first heating arrangement, for emitting a second illumination energy, during a second heating mode, that is directly incident on the second major surface. A reflector arrangement is supported in the chamber interior, having an overall shape that is complementary with respect to the peripheral edge configuration of the workpiece so as to define a complementary reflector configuration for reflecting at least some of the first illumination energy around and onto the peripheral edge region of the workpiece with the reflector arrangement and the workpiece being mutually supported in a way which aligns the complementary reflector configuration with the peripheral edge configuration of the workpiece in a spaced-apart relationship therewith and to cooperatively provide for substantially shadow-free illumination of the second major surface by the second illumination energy, at least during the second heating mode.

In a continuing aspect of the present invention, an apparatus and associated method are described for heat treating at least one substrate having opposing first and second major surfaces which define a configuration of lateral extents of the substrate that is delimited by a peripheral edge configuration. The workpiece is received in a chamber interior that is defined by a processing chamber. A first heating configuration is in thermal communication with the chamber interior for emitting a pre-heating irradiance for inducing a bulk temperature rise of the workpiece progressively during a preheating interval such that changing a relative positional relationship, between the substrate and the first heating configuration, changes an intensity profile of the pre-heating irradiance across the lateral extents of the substrate. A manipulation arrangement is provided for elevationally moving the substrate and/or reflector during the preheating interval to change the intensity profile of the pre-heating irradiance across the lateral extents of the substrate in a way which enhances uniformity of the bulk temperature increase across the configuration of lateral extents of the substrate and for moving the substrate to a treatment position at a treatment station for exposure to a flash irradiance. A second heating configuration is in thermal communication with the chamber interior for emitting the flash irradiance to produce a substantially instantaneous increase in a surface temperature of a selected one of the first and second major surfaces of the substrate.

In an additional aspect of the present invention, an apparatus and associated method are described for manipulating a substrate that is to be exposed to a treatment process at a treatment station such that the substrate, at least potentially and responsive to the treatment process, can move to an offset position from a desired, treatment position at the treatment station. The substrate includes a peripheral edge configuration. A manipulation arrangement is configured and used for movement (i) in a centering mode, with the substrate located on the treatment station, between a disengaged position, that is withdrawn from the substrate, and an engaged position for use in contacting the substrate such that movement from the disengaged position to the engaged position causes the substrate to move from the offset position to within a centering tolerance from the treatment position and (ii) for movement in a lifting mode to elevationally move the substrate between the treatment station and at least one elevated position above the treatment station. In one feature, the substrate includes a peripheral edge configuration and the manipulation arrangement, in the disengaged position, is withdrawn from the peripheral edge configuration by a predetermined distance and, in the engaged position, the manipulation arrangement engages the peripheral edge configuration of the substrate to move the substrate from the offset position to within the centering tolerance of the treatment position.

In another aspect of the present invention, an apparatus and method are described for manipulating a substrate that is to be exposed to a treatment process at a treatment station such that the substrate, at least potentially and responsive to the treatment process, can move to an offset position from a desired, treatment position at the treatment station. The substrate includes a peripheral edge configuration. A manipulation arrangement is configured and used for movement, with the substrate located on the treatment station, between a disengaged position, that is withdrawn from the peripheral edge configuration of the substrate by a predetermined distance, and an engaged position for use in engaging the peripheral edge configuration such that movement from the disengaged position to the engaged position causes the substrate to move from the offset position to within a centering tolerance from the treatment position.

DESCRIPTION OF THE DRAWINGS

The present invention may be understood by reference to the following detailed description taken in conjunction with the drawings briefly described below.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Further, like reference numbers are applied to like components, whenever practical, throughout the present disclosure. Descriptive terminology such as, for example, uppermost/lowermost, right/left, front/rear and the like has been adopted for purposes of enhancing the reader's understanding, with respect to the various views provided in the figures, and is in no way intended as being limiting.

Figure 1:
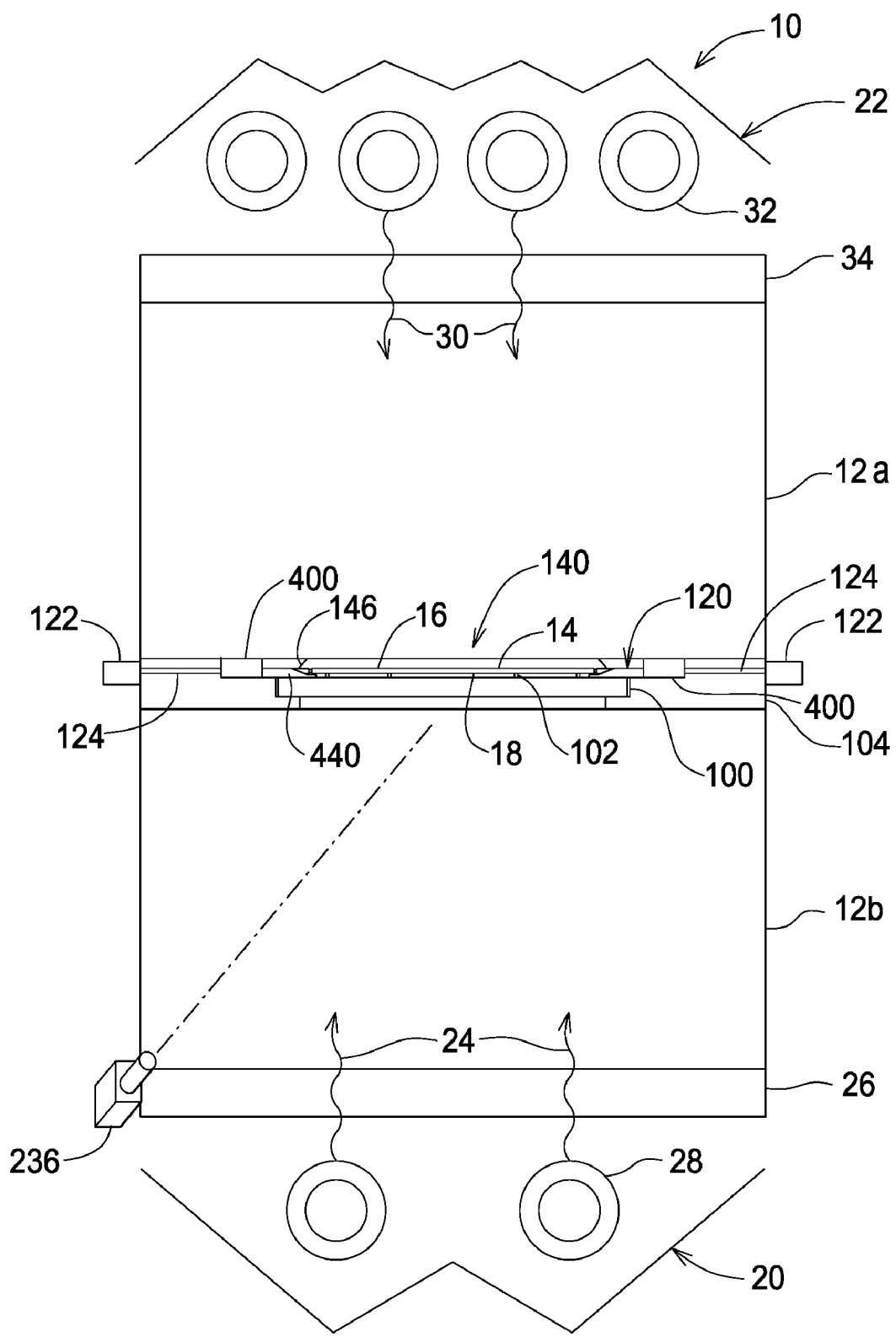
FIG. 1 is a diagrammatic view, in elevation, of a thermal treatment system that is produced in accordance with the present invention.

Referring to FIG. 1, an enhanced Rapid Thermal Processing system is diagrammatically illustrated and generally indicated by the reference numeral 10. System 10 includes an upper chamber portion 12a and a lower chamber portion 12b, which may be referred to collectively as chamber 12, such that at least one workpiece 14 is supported therebetween, as will be further described. Workpiece 14 includes a device side 16, facing upward in the view of the figure and a backside 18, facing downward in the view of the figure. It is to be understood that, while workpiece 14 is represented as a semiconductor substrate or wafer, any suitable type of workpiece may be utilized, so long as the teachings herein remain applicable. Examples of alternative workpieces include, but are not limited to display panels and solar cell substrates. Moreover, the peripheral edge configuration of the substrate is not required to be circular, but may be rectangular or any other useful shape. Upper and lower chamber portions 12a and 12b may include any desirable configuration of interior surfaces such as, reflective regions, absorptive regions, either of which can be made wavelength selective, as well as any useful combinations thereof. In the present example, chamber interior surfaces, aside from windows and other apertures, are all configured as being reflective and, hence, the upper and lower chambers may be referred to as reflector boxes, although any suitable interior chamber surface configuration can be used.

A preheating arrangement 20 is disposed below workpiece 14, generally in a confronting relationship with backside 18 of the workpiece, while a flash heating arrangement 22 is disposed in a confronting relationship with device side 16 of the workpiece. Preheating arrangement 20 may be comprised of any suitable heating source for emitting a preheating irradiance 24 that is capable of inducing a rapid, but uniform bulk temperature rise of workpiece 14, in view of the thermal characteristics of the workpiece, to heat the workpiece to an intermediate temperature. That is, the workpiece is preheated at a rate, and during a corresponding time interval, that is slower than a thermal conduction time through the workpiece. The heating rate to the intermediate temperature may be in the range from approximately 100° C. per second to 400° C. per second to achieve an intermediate temperature in a range from approximately 400° C. to 1250° C. It is noted that preheating irradiance 24 passes through a window 26, described in further detail below, to enter chamber 12a. In the present example, preheating lamps are used, one of which is indicated by the reference number 28, to provide preheating irradiance 24, as will be further described.

Flash heating arrangement 22 is configured for exposing device side 16 of the workpiece to an irradiance flash 30 having a duration that is substantially less than a thermal conduction time of the workpiece using, for example, a plurality of flash lamps, one of which is indicated by the reference number 32. Any suitable flash heating arrangement may be used for purposes of providing irradiance flash 30. Irradiance flash 30 enters chamber 12 through a window 34, which will be described in further detail below. The device side temperature, responsive to irradiance flash 30, may reach a temperature in a range from approximately 1050° C. to a temperature that is close to the melting temperature of silicon, for example, on the order of 1410° C. It is noted that the preheating and flash heating arrangements may use, for example, arc lamps such as those described in U.S. Pat. No. 6,621,199 or in U.S. patent application Ser. No. 10/777,995, both of which are commonly owned with the present application and are incorporated herein by reference. It is noted that such lamps are available from Mattson Technology Canada, Inc. of Vancouver, Canada. As one example of an alternative configuration, with respect to the flash heating arrangement, a microwave pulse generator can be used to produce the irradiance flash in the form of microwave energy. Irrespective of the specific details with respect to the type of energy source that is employed, preheating arrangement 20 and flash heating arrangement 22 are cooperatively operated to modify the device structure. This may move dopant atoms in the workpiece to substitutional sites in the crystal lattice structure, in order to render the dopant atoms electrically active, while avoiding significant diffusion of the dopant atoms within the device structure. In addition, this processing may be used to modify defect densities, crystal structure or many other properties.

Windows 26 and 34 may comprise water cooled windows as described, for example, in U.S. Patent Application Publication no. 2002/0102098, entitled HEAT-TREATING METHODS AND SYSTEM, which is incorporated herein by reference. The use of any suitable window configuration is contemplated, so long as it is sufficiently transparent with respect to the wavelengths that are of interest.

Still referring to FIG. 1, workpiece 14 is supported using a window 100 which receives at least three support pins 102. Both window 100 and pins 102 are generally formed from fused silica. In this regard, it is noted that fused silica has been selected by virtue of an at least approximate transparency to the wavelengths of interest, that comprise preheating irradiance 24, although any suitable material may be used. Window 100 is, in turn, supported by a support plate 104 which can be formed, for example, from water cooled aluminum. A manipulation mechanism 120 is disposed surrounding workpiece 14 at least for purposes of placing the workpiece on support pins 102 and lifting the workpiece therefrom. It is noted that manipulation mechanism 120 may be configured to cooperate with a robot, or other such mechanism (not shown), for purposes of moving the workpiece into and out of chamber 12. A number of highly advantageous arrangements for use as manipulation mechanism 120 are described in copending, commonly owned U.S. patent application Ser. No. 11/018,388, entitled APPARATUS AND METHODS FOR SUPRESSING THERMALLY-INDUCED MOTION OF A WORKPIECE, which is incorporated herein in its entirety by reference. In the present implementation, however, manipulation mechanism 120 serves an additional function that is yet to be described. For the moment, it is sufficient to note that external actuators 122 are used to operate manipulation mechanism 120, corresponding to at least three stations or modules that are spaced apart around the periphery of workpiece 14. In doing so, each actuator 122 moves a shaft 124 in a linear manner, as will be described at an appropriate point below.

Figure 2A:
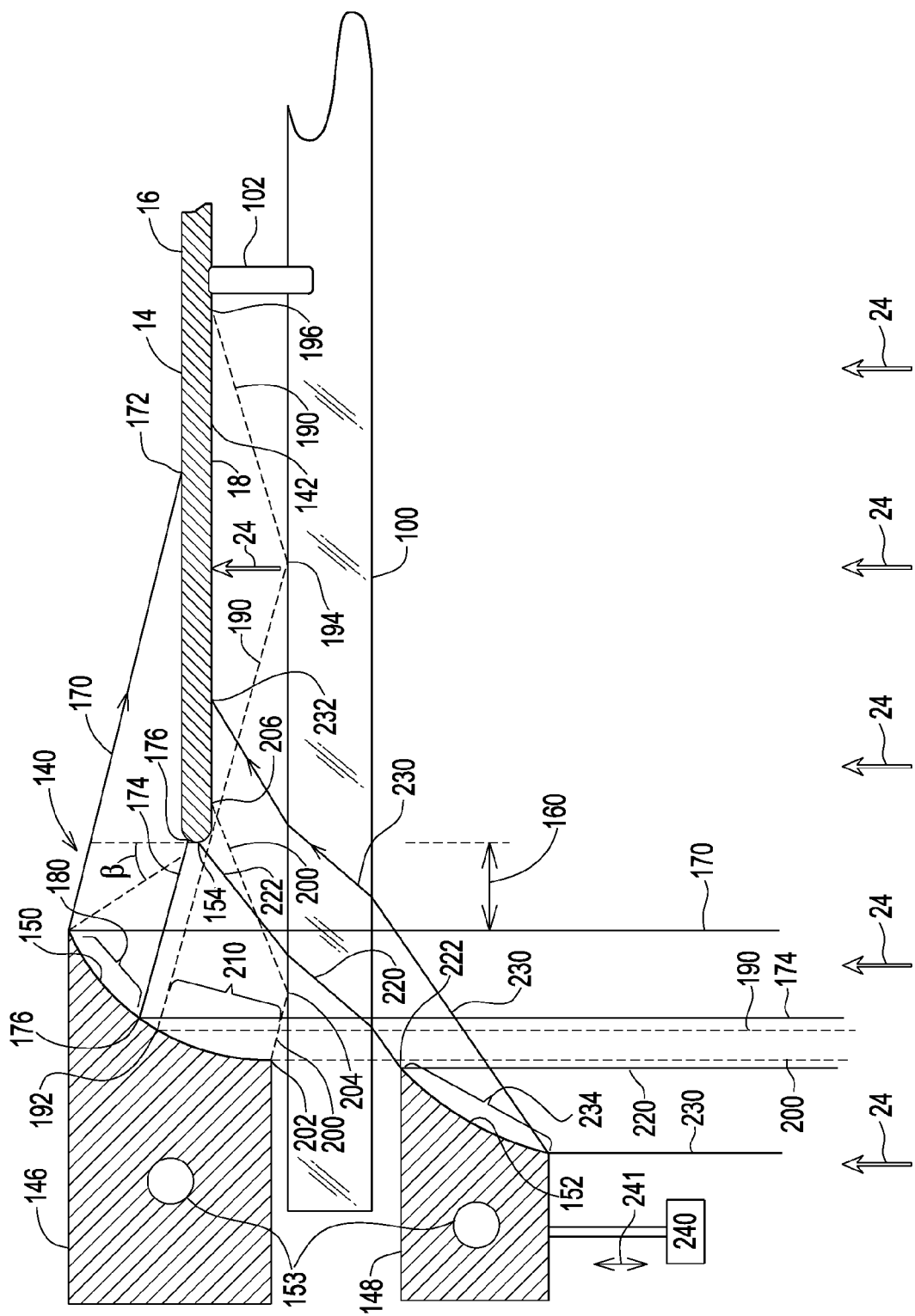
FIG. 2a is a partial diagrammatic cut-away view, in elevation, of a reflector arrangement that is usable in the treatment system of FIG. 1.

Referring now to FIG. 2a, in conjunction with FIG. 1, a reflector arrangement, produced in accordance with the present invention, is generally indicated by the reference number 140. In this regard, it should be appreciated that the reflector arrangement is best illustrated in the enlarged, partial view provided by FIG. 2a, as compared to the overall system view of FIG. 1, as a result of illustrative constraints with respect to FIG. 1. In the diagrammatic view of FIG. 2a, preheating irradiance 24 is indicated using a plurality of parallel arrows, several of which are labeled. It is noted that preheating irradiance 24 has been illustrated as collimated light for illustrative purposes, although it is to be understood that the preheating irradiance contains light having a wide variety of angular orientations. In the region directly below workpiece 14, preheating irradiance 24 passes through support/window 100 and is, thereafter, incident on backside 18 of workpiece 14. As will be seen, reflector arrangement 140 serves in a highly advantageous way so as to redirect a portion of preheating irradiance 24, which would otherwise initially miss workpiece 14, onto a peripheral edge region 142 of the workpiece. The peripheral edge region is considered to include portions of both major surfaces of the workpiece as well as its outermost edge.

Reflector arrangement 140 includes an upper compensator 146 and a lower compensator 148 which define an upper compensator reflector surface 150 and a lower compensator reflector surface 152, respectively. It is noted that FIG. 1 illustrates only upper compensator 146 due to the aforementioned illustrative constraints, although it is to be understood that reflector arrangement 140 can be present in any form described herein. The upper and lower compensators can be formed using any suitable materials such as, for example, aluminum. A cooling arrangement may be used to actively cool the compensators, for example, by defining cooling channels 153 within the compensators which may support a flow of a suitable cooling liquid such as, for instance, water. Reflector surfaces may be formed, for example, using single-point diamond turning to ensure appropriate optical qualities.

Figure 2B:
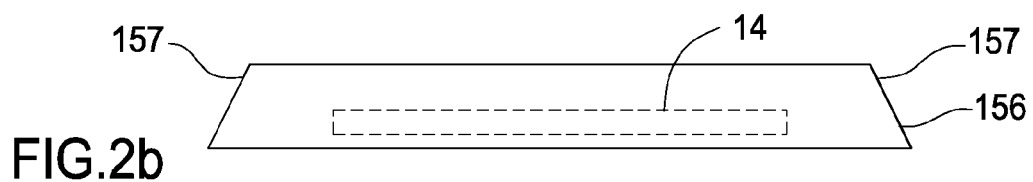
FIG. 2b is a diagrammatic elevational view of a frusto-conical reflector configuration, that is usable in the reflector arrangement of FIG. 2a, shown in relation to a workpiece.

It should be appreciated that each of reflector surfaces 150 and 152 can be provided in a wide variety of configurations. In the present example, the compensator reflector surfaces are vertically curved, as can be seen in the view of the figure, in the form of a second order curve, although curvature is not a requirement. That is, a vertical cross-section that is taken through the reflector surfaces can define a straight line 156, as is illustrated in the diagrammatic elevational view of FIG. 2b, wherein a frustoconical reflector surface 157 is shown in relation to workpiece 14. This cross-sectional sidewall shape may be referred to hereinafter as the "sidecut" of the reflectors. Each reflector surface is configured so as to surround the peripheral edge configuration of the workpiece in a spaced apart relationship therewith. The general shape of the reflector, in this sense, may be referred to herein as the plan view of the reflector configuration. Since the present example contemplates a circular semiconductor wafer as workpiece 14, each reflector surface can be configured as a surface of rotation which surrounds the circular periphery or edge 154 of the workpiece, thereby creating an annular reflector configuration in plan view. It should be appreciated, however, that, even though a wafer is circular, one or both of the reflectors can be noncircular in plan view, for example, for purposes of compensating for nonuniform heating. In this regard, one or both reflectors may have an elliptical or other suitable shape in plan view. With this in mind, it should be appreciated that that the shape of the reflector arrangement can be changed in any suitable manner, irrespective of the fact that the peripheral edge configuration is a multi-sided polygon. Moreover, heating compensation can also be provided by varying the sidecut of one or both of the reflectors at different points around the periphery of the wafer.

Figure 2C:
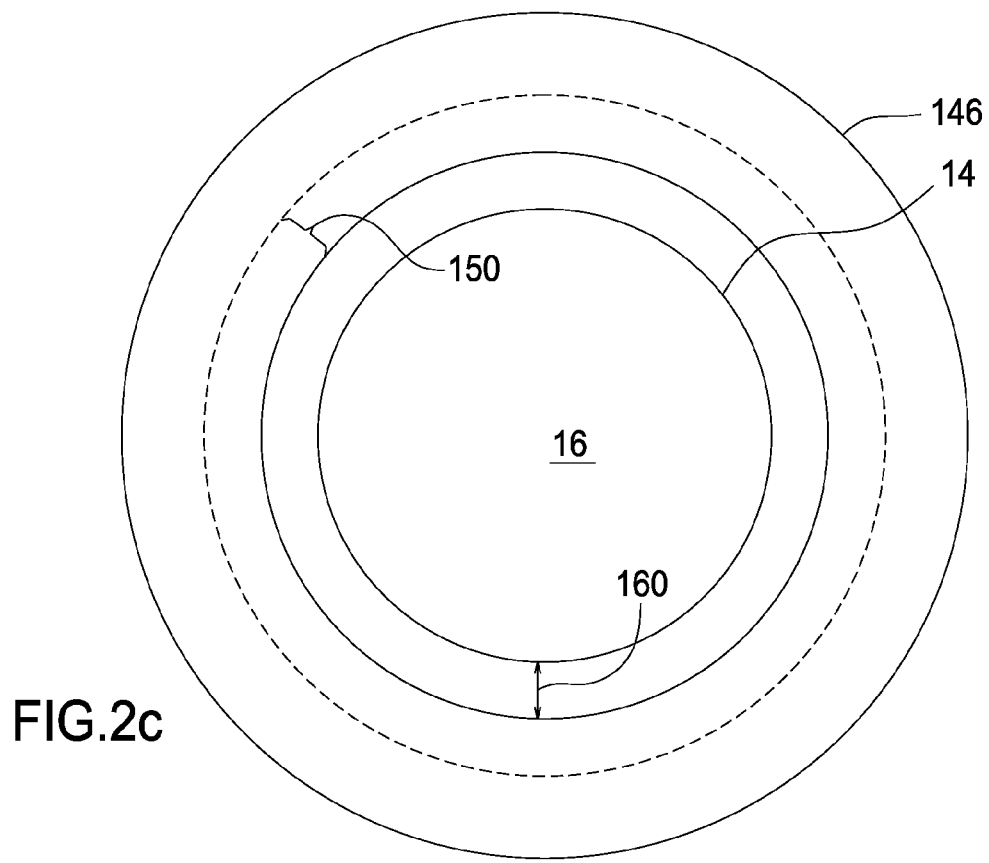
FIG. 2c is a diagrammatic plan view of an upper compensator, which forms part of the reflector arrangement of FIGS. 1 and 2a, shown here to illustrate details with respect to its positional relationship with a workpiece.

Referring to FIGS. 2a and 2c, the configuration of reflector arrangement 140 is highly advantageous with respect to the use of flash heating arrangement 22. In particular, the peripheral configuration of reflector arrangement 140 provides for shadow free illumination of workpiece 14 by flash heating arrangement 22. The reflector arrangement, in order to insure this provision, can be at least somewhat laterally spaced away from peripheral edge 154 of the workpiece. That is, in the plan view of FIG. 2c, upper compensator 146 is shown having its complementary reflector surface 150 outward of the peripheral edge of workpiece 14, particularly with respect to portions of the reflector arrangement that are closer to flash heating arrangement 22 (see FIG. 1) than the workpiece. Accordingly, a projection of either the complementary reflector configuration, as represented by reflector surface 150, or overall upper compensator 146 onto a plane that includes upper, device surface 16 of workpiece 14 is outwardly spaced away from the periphery of the workpiece by at least a minimum distance 160 which may be approximately 3 mm. Although lower compensator 148, likewise, satisfies these requirements, it should be appreciated that it is so positioned for purposes of providing for shadow free illumination by preheating irradiance 24. Further, an angle $\beta$ is illustrated in FIG. 2a, defined between a vertical direction and an uppermost edge of reflector arrangement 146. Maintaining a value of $\beta$ in excess of 45° has been found to be useful in maintaining shadow free illumination from flash heating arrangement 22. More preferably, $\beta$ may be at least 60°. It is again noted that the figures are not to scale so that the illustrated angle may appear horizontally compressed. The concepts taught with respect to $\beta$ are equally applicable with respect to the relationship between workpiece 14, lower compensator 148 and pre-heating arrangement 20. Further, it is noted that the aforementioned minimum spacing may alternatively be set forth as a minimum distance between any given position on the reflector configuration and a nearest position on the workpiece such as, for example, approximately 15 mm. Such a minimum spacing is best illustrated in FIG. 2a as a distance between workpiece edge 154 and the uppermost, inner edge of upper compensator 146. It should further be appreciated that complementary configured reflector surface 150 of upper compensator 146 is the only portion of the compensator that faces or is in a confronting relationship with workpiece 14. Another expedient, that may be used in avoiding shadowing on workpiece 14 by reflector arrangement 140 resides in lowering the reflector arrangement, relative to the workpiece, before the latter is exposed to flash irradiance 30. Such lowering, in effect, causes the relative positioning of the workpiece, flash heating arrangement 22 and reflector arrangement 140 to conform with the foregoing descriptions, in terms of angle β, at least for the limited duration of the irradiance flash.

Figure 2D:
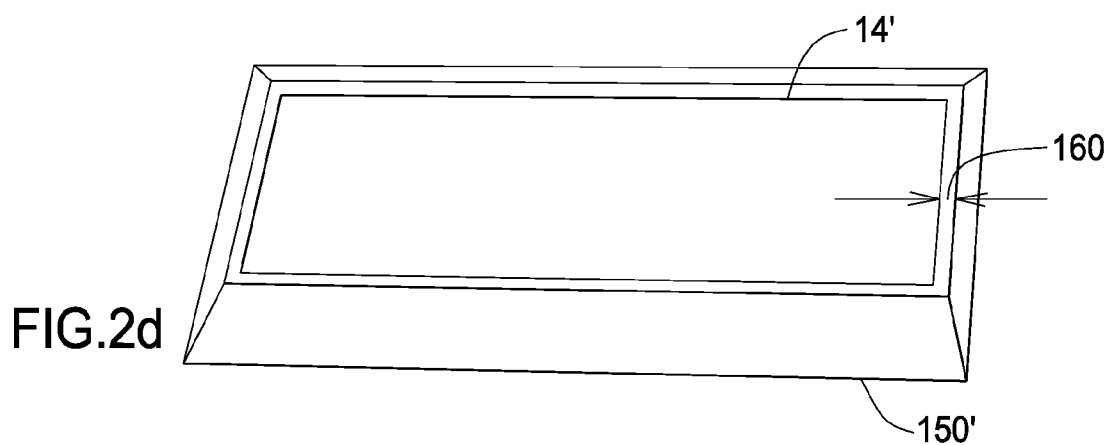
FIG. 2d is a diagrammatic view, in perspective, showing a rectangular-shaped workpiece and a complementary configured reflector surface.

FIG. 2d illustrates an alternative configuration using a modified reflector surface 150' shown diagrammatically in relation to a rectangular workpiece 14'. Modified reflector surface 150' takes on the shape of a truncated rectangular-based pyramid. In this regard, it should be appreciated that a wide variety of alternative workpiece and reflector configurations are possible, all of which are considered to fall within the scope of the present invention.

Having described the structure of reflector arrangement 140 and its position with respect to other components of system 10, attention is now directed to details with respect to the manner in which the reflector arrangement redirects a portion of preheating energy 24 onto peripheral edge region 142 of the workpiece. This description will again be framed as if preheating energy 24 were collimated, although this is understood not to be the case, for purposes of enhancing the reader's understanding. More particularly, the description will consider specific rays that are illustrated in FIG. 2a in traveling from the preheating arrangement to the workpiece. Initially directing the discussion to upper compensator 146, a first ray 170 is incident upon upper compensator reflector surface 150, at substantially its furthest point from the preheating arrangement. Accordingly, ray 170 is reflected and, thereafter, incident at a point 172 on device side 16 of the workpiece. It is noted that point 172 is spaced inward somewhat from edge 154 of the workpiece. A second ray 174 is incident at a point 176 on the upper compensator reflector surface and is reflected so as to be incident substantially on edge 154 of the workpiece. Hence, at least with respect to the described "collimated" rays, a vertical band or region 180, of the upper compensator reflector surface, redirects preheating energy that would otherwise miss the workpiece, to an annular region of the workpiece including and between points 172 and 176 on device side 16.

Still considering the operation of upper compensator reflector surface 150, a ray 190 is incident on the reflector surface at a point 192, below aforedescribed point 176, in the view of FIG. 2a. Ray 190 reflects from the upper compensator and is then reflected by window/support member 100 at a point 194, to then be incident on a point 196 of backside 18 of the workpiece. Thus, ray 190 undergoes two reflections. Similarly, a ray 200 is incident upon a lowermost point 202 of upper compensator reflector surface 150 and is reflected so as to then be incident on a point 204 that is defined by the upper surface of window 100. Ray 200 is then incident on a point 206 very near edge 154, but on backside 18 of the workpiece. Again, at least with respect to the described "collimated" rays, a vertical band or region 210, of the upper compensator reflector surface, redirects preheating energy that would, at least initially, otherwise miss the workpiece, to an annular region of the workpiece including and between points 196 and 206 on backside 18. In view of the foregoing, upper compensator 146 is considered to be remarkably advantageous in its ability to simultaneously illuminate device side 16, peripheral edge 154 and backside 18 of the workpiece in cooperation with window 100. At the same time, however, it should be appreciated that upper compensator 146 can be configured with a sidecut that excludes one of regions 180 or 210. Moreover, edge 154 can be excluded from illumination, independent of whether one of regions 180 or 210 is excluded with respect to light 24.

Still referring to FIG. 2a, attention is now directed to the operation of lower compensator 148, again based on the illustrated collimated preheating energy 24 that is incident on lower reflector surface 152. In particular, a ray 220 is incident on an uppermost portion of reflector surface 152 at a point 222. Ray 222 is then reflected from lower compensator reflector surface 152 and is refracted as it passes through window 100. Thereafter, ray 220 emerges from window 100 and is incident upon edge 154 of the workpiece. Similarly, a ray 230 is incident upon reflector surface 152 proximate to its lowermost edge and is reflected therefrom. Ray 230 is then refracted as it passes through window 100 and is then incident upon workpiece 14, but at a point 232 that is spaced peripherally inward with respect to workpiece edge 14. Thus, region 234 corresponds to the entire vertical sidecut of lower compensator reflector surface 152 by redirecting preheating energy primarily from edge 154 peripherally inward, onto backside surface 18 of the workpiece. Like upper compensator 146, lower compensator 148 serves to redirect preheating energy onto the peripheral edge region of workpiece 14, which preheating energy would, at least initially, otherwise miss the workpiece.

Having described the operation of upper and lower compensators 146 and 148, respectively, with regard to collimated energy that is at least approximately normal to the major surfaces of the workpiece, it is considered that rays having many other orientations will be directed from these compensators onto the peripheral edge region of the workpiece, depending upon their specific angle of incidence on the compensator reflector surface in conjunction with their specific point of incidence.

At this juncture, it is appropriate to note that different wafers or workpieces can have different optical absorption and emission properties that can affect net energy loss from the wafer edge. Thus, adjustments in the configuration of the reflector arrangement can be made on the basis of workpiece characteristics. Moreover, adjustment of the reflector arrangement can be necessary on the basis of changing the heating protocol. For example, if the preheating ramp rate is increased, the incident power is increased and, thus, the irradiance from reflector arrangement 140, correspondingly increases. At the same time, a faster preheating ramp rate reduces the time the workpiece has to radiate energy, so that edge losses occur over a shorter time interval. The net result can lead to the peripheral edge region being too hot for a given configuration of the reflector arrangement. Conversely, reducing the ramp rate can cause the peripheral edge region to be too cool. Replacing the reflector arrangement with one designed specifically for a modified ramp rate is one approach with respect to correction for the "hot" or "cool" edge, however, one highly advantageous approach will be described immediately hereinafter.

Continuing to refer to FIG. 2a, it should be understood that upper compensator 146 and lower compensator 148 can be used either individually or in combination to achieve a desired level of edge heating compensation. Further, it is apparent from this figure that each of upper compensator 146 and lower compensator 148 produces a reflected energy pattern that changes responsive to changes in a relative vertical positional relationship between the workpiece and each of the compensators. Changing the relative positional relationship can be accomplished by moving the workpiece or the reflector or both. For example, if workpiece 14 is moved upward in the view of the figure, upper compensator 146 will reflect preheating energy 24 onto a narrower portion or band of the workpiece peripheral edge region. That is, point 172 will move toward the left, in the view of the figure, toward edge 154. Preheating characteristics, therefore, can be adjusted by adjusting the vertical positional relationship between the workpiece and the compensator or compensators that are in use. Thus, for a given workpiece, the vertical positional relationship between the reflector arrangement and workpiece can be adjusted in order to compensate for specific characteristics of that workpiece. Similarly, the vertical positional relationship is adjustable in view of changing the ramp preheating rate or preheating interval duration, in order to reduce or enhance edge heating, based on a particular set of circumstances. Thus, in this way, the aforedescribed hot or cool edge problem is resolved. In one implementation, using an infrared digital camera, as described in U.S. Pat. No. 6,303,411, which is commonly owned with the present application and incorporated herein by reference, the workpiece edge temperature can be monitored, although it is to be understood that any suitable temperature sensing configuration can be used. This monitored temperature can then be used for process feedback control to establish the wafer/reflector relative positional relationship. FIG. 1 illustrates an infrared camera 236 for use in such temperature monitoring. Alternatively, multiple radiometers can be used to measure the edge temperature, compared to the wafer center for feedback control.

In this regard, it is noted that such compensation can be dynamic by changing the relative vertical positional relationship during the preheating cycle. Thus, as an example, a linear actuator arrangement 240, can be used to move lower compensator 148 as indicated by a double-headed arrow 241, where the lower compensator is used individually. Accordingly, one having ordinary skill in the art will recognize that this linear actuator could just as readily be applied for purposes of moving upper compensator 146 or for moving the entire reflector arrangement by appropriately configuring support plate 100 to cooperate with the reflector arrangement. As another alternative, the upper and lower compensator can be moved simultaneously or independently in opposing directions; that is, either toward or away from one another. It should further be appreciated that an embodiment is contemplated wherein a movement mechanism provides for preheating using reflector arrangement 140, as described above, and then serving to change the positional relationship between the flash heating arrangement, reflector arrangement and workpiece to provide for shadow-free illumination of the device side of the workpiece by the irradiance flash, using flash heating arrangement 22. For example, reflector arrangement 140 can be lowered during the irradiance flash.

With respect to the upper and lower compensators described above, it should be appreciated that the reflective performance that is produced by the reflective surface of either compensator can be fine tuned, for example, by modifying the shape of the sidecut of the defined reflective surfaces, as well as by changing the area of the reflective surface. Other techniques, however, are also recognized for use in fine tuning the performance of either of the compensators, which do not necessitate actually changing spatial relationships or geometry in a particular implementation. For example, the reflective surface of a compensator can be coated to increase or decrease heating efficiency with respect to the spectral content of the incoming radiation, in conjunction with workpiece radiation absorptivity by modifying its reflectivity at certain wavelength regions. As another example, the spectral response of the reflective surface can be changed in a desired way. As still another example, the diffusivity of the reflective surface can be changed. Increasing the diffusivity, for instance, will tend to blur or widen the illuminated area, thereby reducing intensity. Another technique for fine tuning the response of one of the compensators relies on segmenting the reflective surface of the compensator, as will be described immediately hereinafter.

Figure 3:
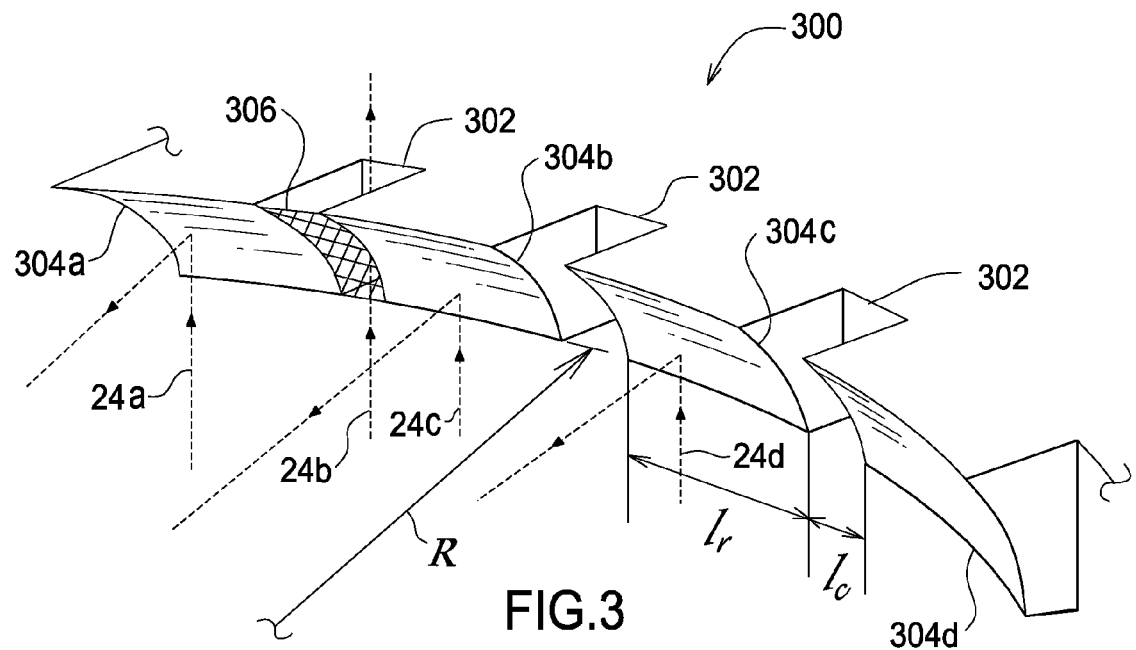
FIG. 3 is a partially cut-away view, in perspective, of a segmented compensator that is usable in the reflector arrangement of FIG. 1.

Referring to FIG. 3, a segmented compensator, produced in accordance with the present invention, is generally indicated by the reference number 300 and is partially shown in a cut-away, perspective view. Again, operation of this compensator will initially be presented with respect to collimated rays 24 of FIG. 2a, in order to enhance the reader's understanding, although it is to be understood that a wide variety angles of incidence are possible. More specifically, rays 24a–d are illustrated. Segmented compensator 300 includes a plurality of cutouts 302, a number of which are indicated, spaced apart around the periphery of the compensator. A plurality of reflector segments, indicated by the reference numbers 304a–d, are illustrated between cutouts 302. While rays 24a, 24c and 24d are incident on reflector segments 304a, 304c and 304d, respectively, ray 24b passes through one of cutouts 302, unaffected by compensator 300. In this regard, one alternative to the use of cutouts 302 resides in coating what would be a corresponding portion of the reflective surface with an absorber 306 (represented by hatching), such that ray 24b would be absorbed, rather than passing through compensator 300 unaffected. It must be borne in mind, with respect to such use of "absorber" segments, that the compensator temperature will rise, corresponding to the amount of additional energy that is absorbed. Alternatively, the surface corresponding to absorber 306 can be treated so as to increase its diffusivity so as to act less effectively than the untreated regions of reflector surface. Suitable materials for use in forming compensator 300 include, for example, aluminum. Techniques for producing the desired, segmented configuration are well-known in the art. Details with respect to the design of compensator 300 will be provided immediately hereinafter.

Still referring to FIG. 3, cutouts 302 may be viewed, in effect, as changing the average reflectivity of the compensator, as compared to an unmodified compensator having a reflector surface without cutouts. With respect to uniformity, it should be appreciated that the reflector segments generally do not form a sharp image on the workpiece. If the objective is a high degree of uniformity of exposure, the number of cutouts can be increased, with a corresponding increase in the number of reflector segments. In this regard, response of compensator 300 can be customized, based on the period and width of slots 302, in consideration of a uniform distribution about the periphery of compensator 300. For purposes of this analysis, R is the radius of compensator 300, as indicated, and k is a desired attenuation ratio, $l_r$ is the length of the reflective portion of the arc, as measured about the generally circular periphery of the compensator, $l_c$ is the length of the removed portion of an arc that corresponds to each slot 302, and n is the number of cutouts. Initially, the segmented compensator can be characterized by:

$$k = \frac{l_c}{l_r} \quad (1)$$

$$n(l_c + l_r)2\pi R \quad (2)$$

which yields:

$$l_c = kl_r \quad (3)$$

$$n = \frac{2\pi Rk}{l_c(k+1)} \quad (4)$$

It is recognized that the greater the number of cutouts, n, the smoother the spatial attenuation about the periphery of compensator 300, resulting in increased uniformity on the peripheral edge of the workpiece. Further, under high density irradiation conditions, $l_r$ (length of reflective portion of arc) should be limited to its smallest practical value, but of sufficient size to avoid deterioration resulting from a reduced volume, which produces less efficient cooling and increased risk of radiation damage.

Having described the highly advantageous reflector arrangement of the present invention in detail above, is appropriate at this juncture to briefly consider the prior art. In particular, Applicants are unaware of any reflector arrangement in the prior art which provides effective compensation for edge cooling of a workpiece during a preheating interval when one side of the workpiece confronts a preheating arrangement and wherein this reflector arrangement cooperates with a flash heating arrangement for illuminating the opposite side of the workpiece in a substantially shadow free manner.

Figure 4:
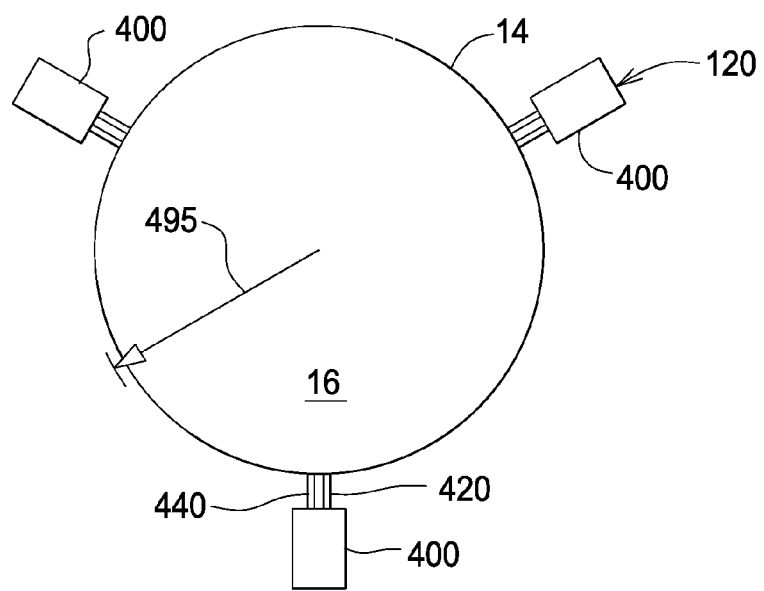
FIG. 4 is a diagrammatic plan view of a manipulation arrangement, that is used in the system of FIG. 1, shown here to illustrate further details with respect to its relationship to a workpiece.

Referring to FIGS. 1 and 4, attention is now directed to details with respect to manipulation arrangement 120. FIG. 4 provides a diagrammatic plan view of workpiece 14 and manipulation arrangement 120. In this regard, the manipulation arrangement includes at least three manipulation modules 400 that are spaced about around the periphery of the workpiece. Although a workpiece has been illustrated in FIG. 4 having a circular peripheral edge configuration, it is to be understood that the concepts that are about to be brought to light are readily applicable with respect to workpieces having alternative peripheral edge configurations, for example, by adjusting the position and number of manipulation modules.

Figure 5:
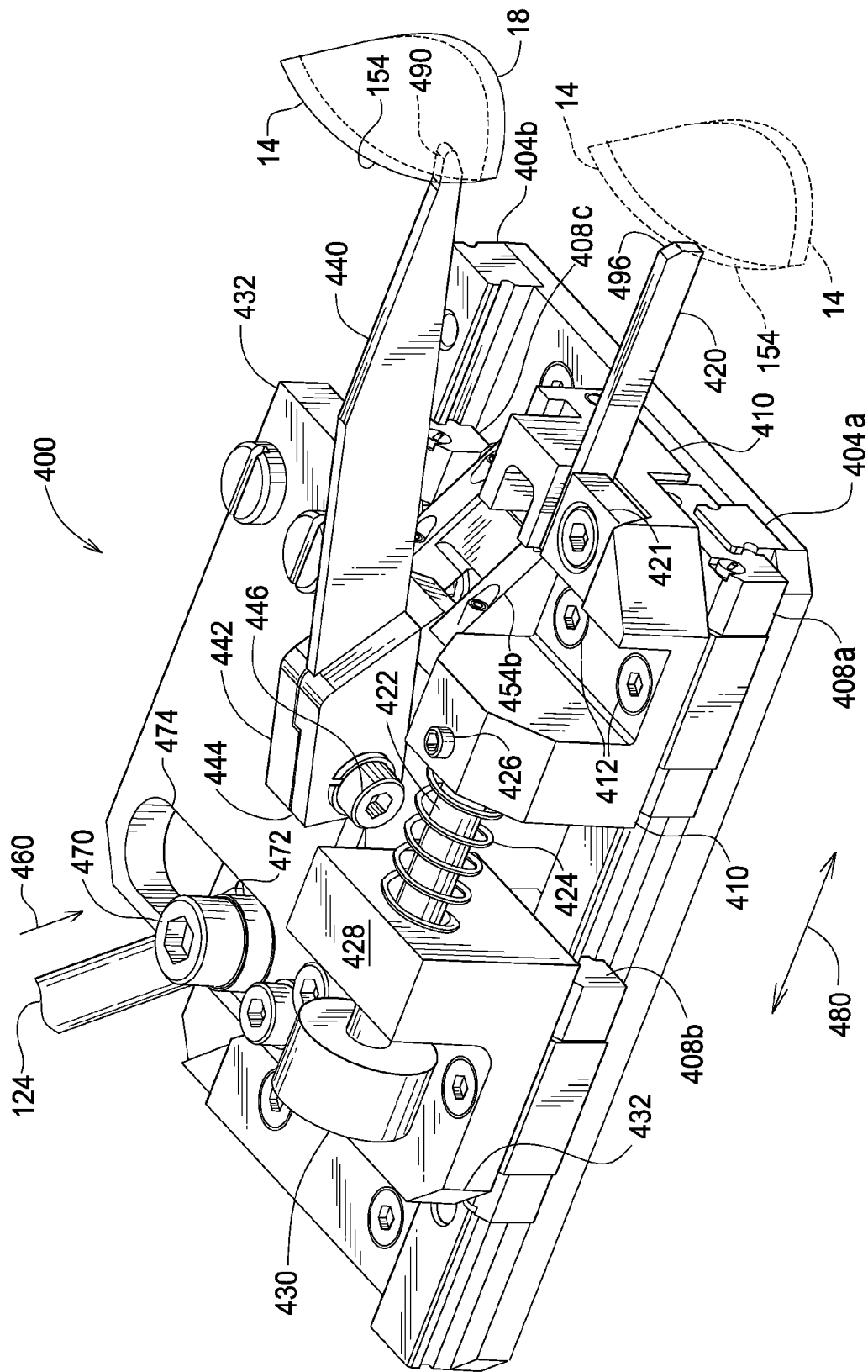
FIG. 5 is a perspective view of a manipulation module, a number of which are spaced around the periphery of a workpiece, to form the manipulation arrangement of FIGS. 1 and 4.

Referring to FIG. 5, attention is now directed to details with respect to the structure of manipulation module 400, which is further enlarged in this perspective view. Module 400 includes a baseplate 402 which supports first and second spaced apart, parallel rails 404a and 404b. Rail 404a slidingly receives a first carriage 408a and a second carriage 408b, while a third carriage 408c is slidingly received by second rail 404b. First carriage 408a supports a centering finger mount 410 that is connected to the first carriage using fasteners 412. A laterally extending centering finger 420 extends in the direction of the workpiece, which is shown in phantom adjacent to the centering finger. The centering finger may be formed from any suitable material such as, for example, quartz. A wedge member 421 is used with a fastener to adjustably hold centering finger 420 in place. A guide member 422 extends rearwardly from an opposing side of centering finger mount 410 and concentrically receives a biasing spring 424. Guide member 422 passes through a guide block 428 and includes a free end supporting a stop piece 430. Guide block 428 forms an integral part of a secondary movement platform 432 which is attached to carriage 408b and 408c such that the secondary movement platform can move slidingly on rails 404a and 404b, independent of the sliding movement of centering finger mount 410.

Figure 6:
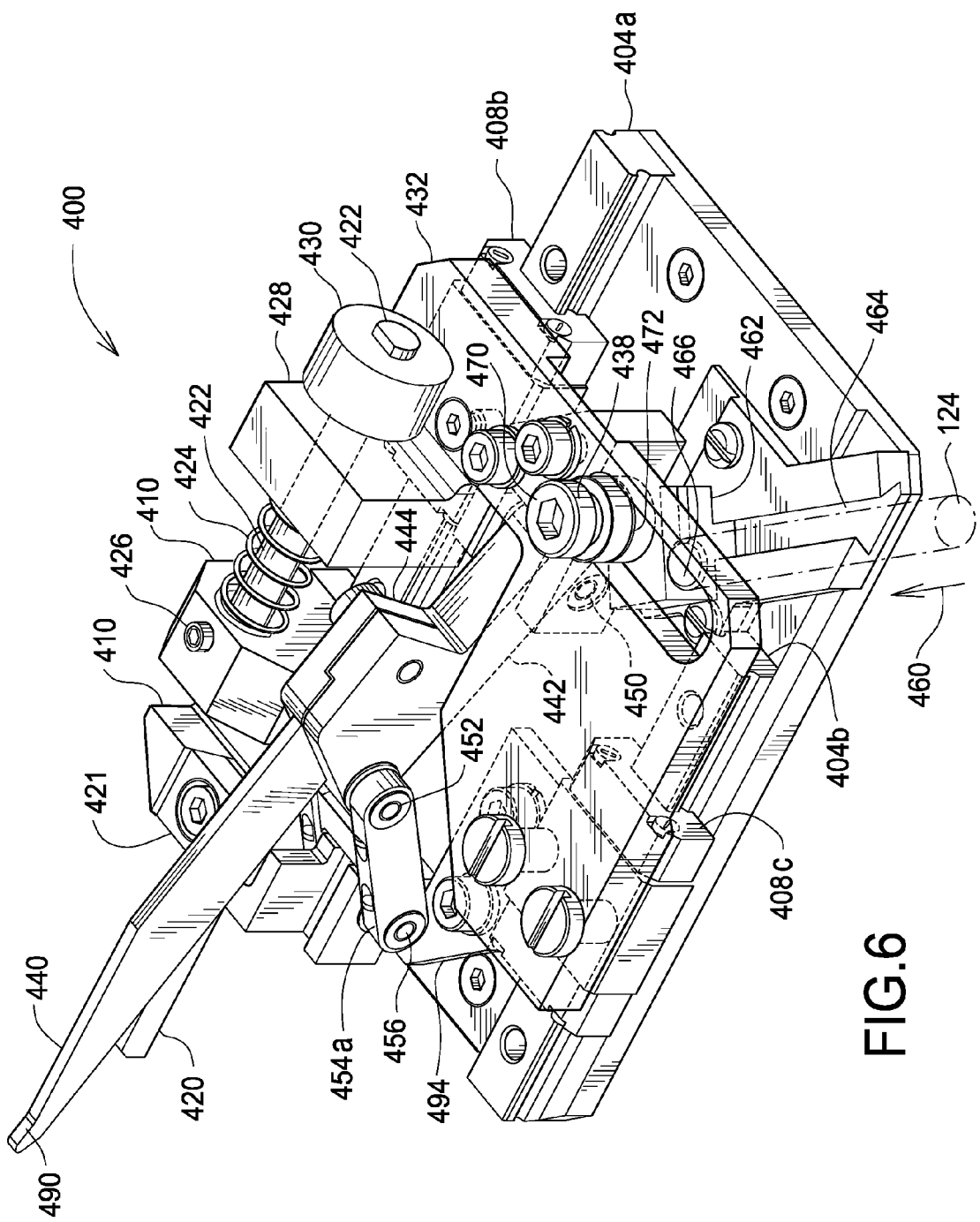
FIG. 6 is another perspective view of the manipulation module of FIG. 5, shown here to illustrate further details with respect to its structure.

Referring to FIG. 6 in conjunction with FIG. 5, the former is a perspective view that has been taken from a direction that better illustrates certain details with respect to the way in which linear actuator arm 124 (shown in phantom in FIG. 6) engages the lifting module and with respect to the mechanism that is used to support and move a lifting arm 440. It is noted that some components have been rendered transparent (e.g., a base plate which forms part of secondary movement platform 432) in order to better reveal the mechanics that support the lifting arm and engage linear actuator shaft 124. In particular, a lifting arm support link 442 supports lifting arm 440, for example, using a clamping arrangement having a clamping plate 444 and fastener 446 to adjustably mount lifting arm 440 to link 442. As seen in FIG. 6, hinges 450 hingedly connect lifting arm support link 442 to platform 432. At an opposing end of the lifting arm link, proximate to lifting arm 440, hinges 452 hingedly connect lifting arm link 442 to a pair of pivot links 454a (best seen in FIG. 6) and 454b (best seen in FIG. 7). Hinges 456 hingedly connect pivot links 454a and 454b to centering finger mount 410. Accordingly, this arrangement hingedly supports lifting arm support link 442 between platform 432 and centering finger mount 410. It is noted that lifting arm 440 is shown in FIG. 5 holding the workpiece in a raised position. Specific details with respect to the highly advantageous operation of manipulation module 400 will be provided immediately hereinafter.

Still referring to FIGS. 5 and 6, linear actuator shaft 124 moves in a direction indicated by an arrow 460 for purposes of moving secondary movement platform 432 in a direction at least generally toward workpiece 14. Specifically, manipulation module 400 is advantageously configured such that the linear actuator shaft is not required to move in a direction that is parallel to the direction of movement of secondary movement platform 432. In order to accomplish this translation, best seen in FIG. 6, a slider 462 is received in a dovetail groove 464 for sliding movement therein. Slider 462 includes a clamping arrangement defining an opening 466 for receiving a free end of linear actuator arm 124. A threaded fastener 470 is tightened to clamp the free end of the linear actuator into opening 466. Fastener 470 also supports a bearing 472 that is positioned within a slot 474 (best seen in FIG. 5). In this way, lateral movement of bearing 472 occurs as linear actuator 124 is advanced and retracted in a way which causes secondary movement platform 432, in turn, to advance and retract along rails 404a and 404b in a direction that is indicated by a double-headed arrow 480. Accordingly, an angular approach of linear actuator shaft 124 is accommodated.

Figure 7:
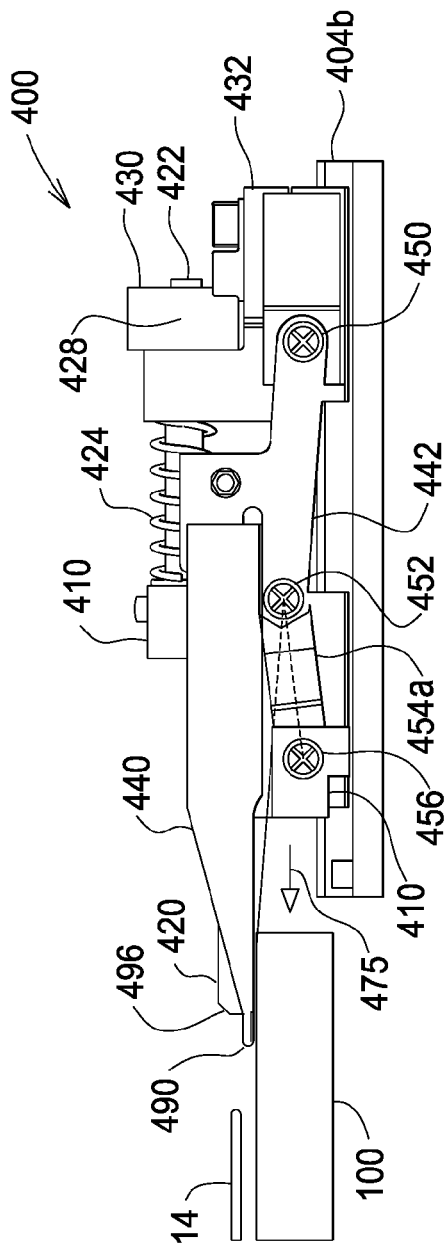
FIG. 7 is a diagrammatic view, in elevation, of the manipulation module of FIGS. 5 and 6, shown here to illustrate the manipulation module in a retracted or withdrawn position with respect to a workpiece.

Referring to FIG. 7 in conjunction with FIGS. 5 and 6, the former illustrates manipulation module 400 with lifting arm 440 in its fully lowered position and with centering finger 420 in its fully withdrawn or retracted position with respect to wafer 14. As linear actuator shaft 124 moves in direction 460 in FIGS. 5 and 6, centering finger mount 410 moves in a direction 475 in unison with secondary movement platform 432. Movement of centering finger mount 410 occurs as a result of biasing force that is applied from the secondary movement platform through spring 424. It should be appreciated that a lifting end 490 of the lifting arm moves laterally in unison with centering finger 420, as seen in FIG. 7. At the same time, lifting end 490 is configured to move beneath workpiece 14, as will be further described.

Figure 8A:
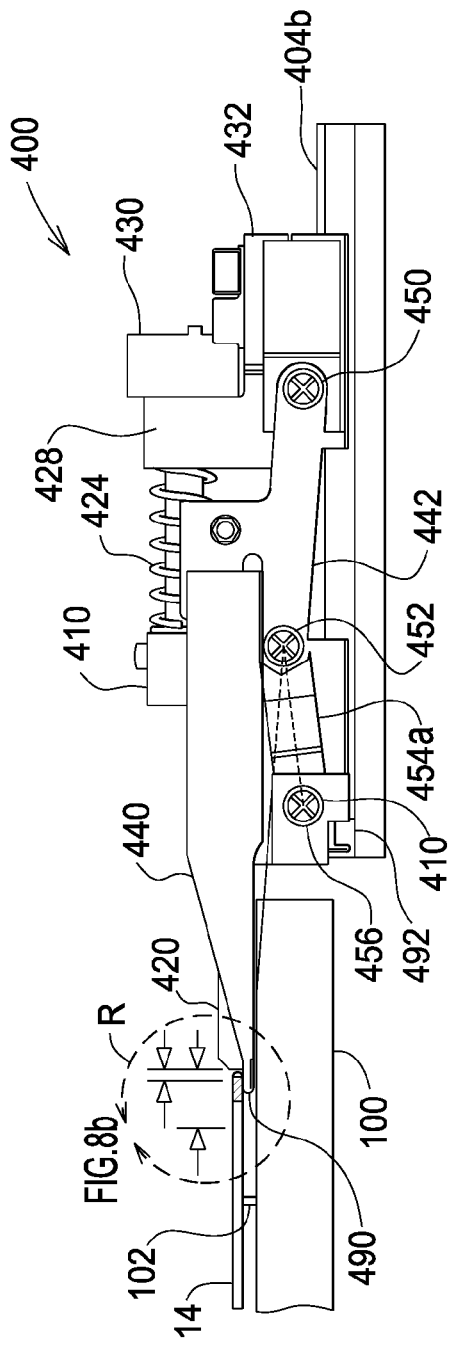
FIG. 8a is another diagrammatic view, in elevation, of the manipulation module of FIGS. 5 and 6, shown here to illustrate the manipulation module in a centering, limit position for purposes of returning the workpiece to within a centering tolerance of a centered position from an offset position.

Referring to FIG. 8a, the mechanism of the manipulation module is illustrated after having moved secondary movement platform 432 and centering finger mount 410 to a limit position in the direction of arrow 460 (see FIGS. 5 and 6).

In doing so, centering finger mount 410 encounters a stop 492. It is noted that stop 492 is defined by a stop plate 494 that is best seen in FIG. 6. This stop plate is held in position by a pair of fasteners and can be adjusted using these fasteners. Centering finger 420, in the view of this figure, has engaged the peripheral edge of workpiece 14 and caused the workpiece to move to a centered position.

Figure 8B:
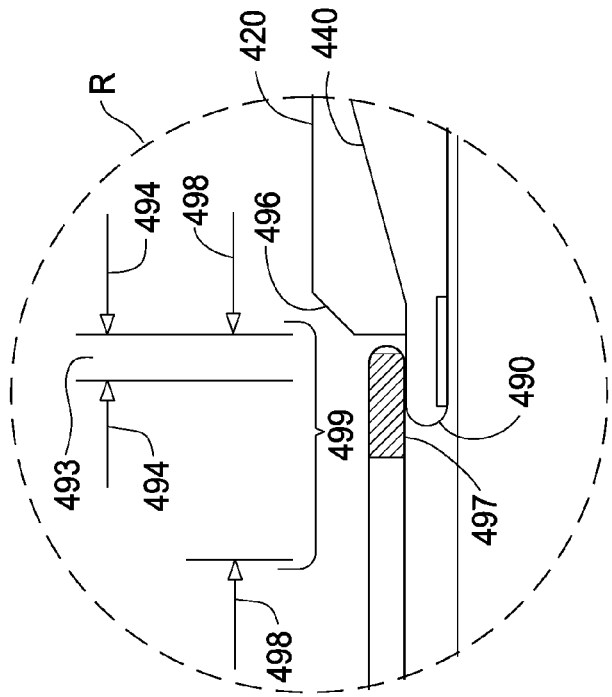
FIG. 8b is a further enlarged partial view of a region of FIG. 8a, shown here to illustrate details with respect to the relationship between a centering finger and lifting arm, which form parts of the manipulation module, and the workpiece during centering operations.

Referring to FIG. 8b in conjunction with FIGS. 4 and 8a, the former provides an enlarged view of a region R, that is indicated within a dashed circle. It is important to understand that manipulation modules 400 are spaced about the periphery of workpiece 14, as illustrated by FIG. 4 such that the centering fingers cooperate to simultaneously, resiliently bias the workpiece to the centered position. The centering fingers are adjusted to provide some acceptable, but limited centering tolerance, 493 that is indicated between a pair of arrows 494, from a centered position such that a centering radius 495, shown in FIG. 4, is slightly greater than the radius of the workpiece, although this has been greatly exaggerated in the view of FIG. 4. In this way, the workpiece is readily lifted from between the extended centering fingers and then returned to a position between the centering fingers. This latter action is assisted by a bevel 496 (best seen in FIG. 5) that is formed at an upper corner of centering finger 420. No further movement of centering finger 420 is obtained with additional movement of linear actuator shaft 124 in the direction of arrow 460, following engagement with stop 492. From the position of FIGS. 8a and 8b, further linear actuator movement in the direction of arrow 460 (FIG. 6), causes manipulation module 400 to enter a lifting mode in which secondary movement platform 432 moves toward centering finger mount 410, thereby compressing spring 424, as seen in FIGS. 5 and 6.

Referring again to FIG. 8b, attention is directed to details with respect to the relationship between lifting arm 440, fully extended under workpiece 14, as limited by centering finger 420 and with respect to a cross-hatched region 497 of the peripheral edge region of the workpiece, which represents a margin or band of the workpiece that is outside of what is generally considered as the device area of the workpiece, for reasons which relate to processing constraints that are outside the scope of the present disclosure. What is of interest, however, is that lifting end 490 cooperates with centering finger 420 in a way which causes the lifting end to extend beneath workpiece 14 by an amount that is less than a width of margin 497. The significance of this arrangement will be further discussed at an appropriate point below. Moreover, a potential lateral movement range 499 of the workpiece, responsive to thermally induced movement by flash heating, is represented between a pair of arrows 498. Potential lateral movement range 499 is far greater than centering tolerance 493, as will be further discussed at an appropriate point below.

Figure 9:
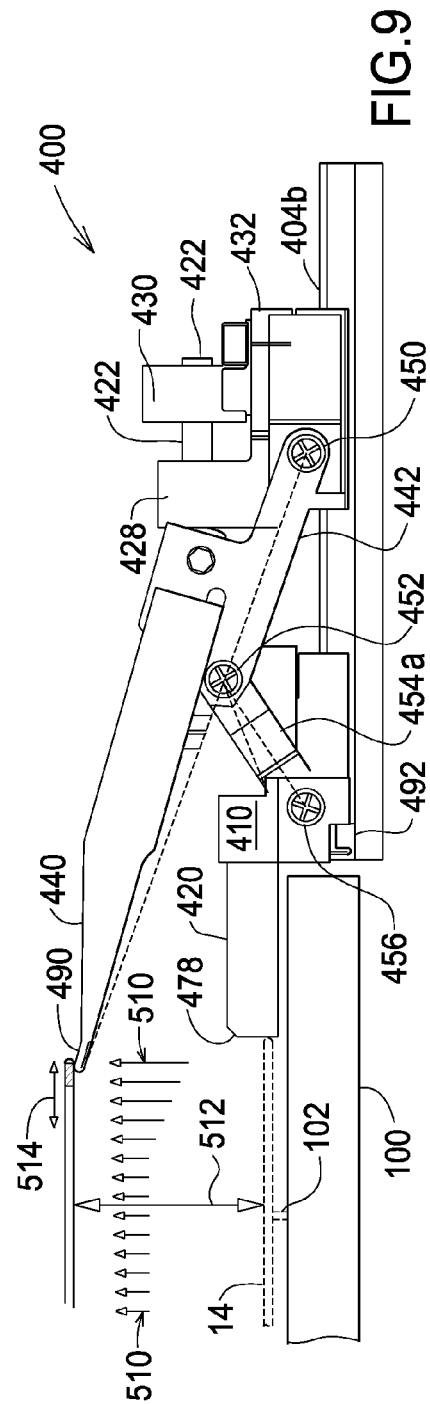
FIG. 9 is still another diagrammatic view, in elevation, of the manipulation module of FIGS. 5 and 6, shown here to illustrate the manipulation module in a lifting and dynamic movement mode for purposes of varying a heating profile across the lateral extents of a workpiece.

Attention is now directed to FIG. 9 in conjunction with FIG. 8a. The former illustrates manipulation module 400 after having lifted workpiece 400 to a maximum lift position. Comparison of FIGS. 8a and 9 reveals that lifting end 490 of lifting arm 440 has moved, at least generally, straight up so as to significantly avoid rubbing against the backside of the workpiece. This movement is accomplished through the use of a Daniel's linkage, which is well known in the art and described in detail, for example, in Mechanisms and Mechanical Devices Sourcebook by Nicholas P Chironis & Neil Sclater, McGraw-Hill, 1991. Specifically, lifting arm support link 442 and pivot links 454a,b, cooperate to form a Daniel's linkage as secondary movement platform 432 moves toward centering finger mount 410. The maximum lifting height is defined by the specific configuration of the Daniels linkage. While workpiece 14 is shown at a maximum height in FIG. 9, it is important to understand that the workpiece can be moved to any desired position between the fully raised position of FIG. 9 and the fully lowered position of FIG. 7. Moreover, this movement can be performed dynamically, for example, during a preheating interval, as discussed above. Lowering the workpiece, from a raised position, proceeds in reverse order through FIGS. 7, 8a and 9, resulting in release of the workpiece within the centering tolerance from the centered position. It should also be appreciated that manipulation modules 400 can be used to re-center the workpiece at any desired time by moving centering fingers 420 from the withdrawn position of FIG. 7 to engage the workpiece in the centering mode of operation that is illustrated by FIG. 8 and then returning to the withdrawn position of FIG. 7. This feature is considered as highly advantageous in and by itself.

Figure 10:
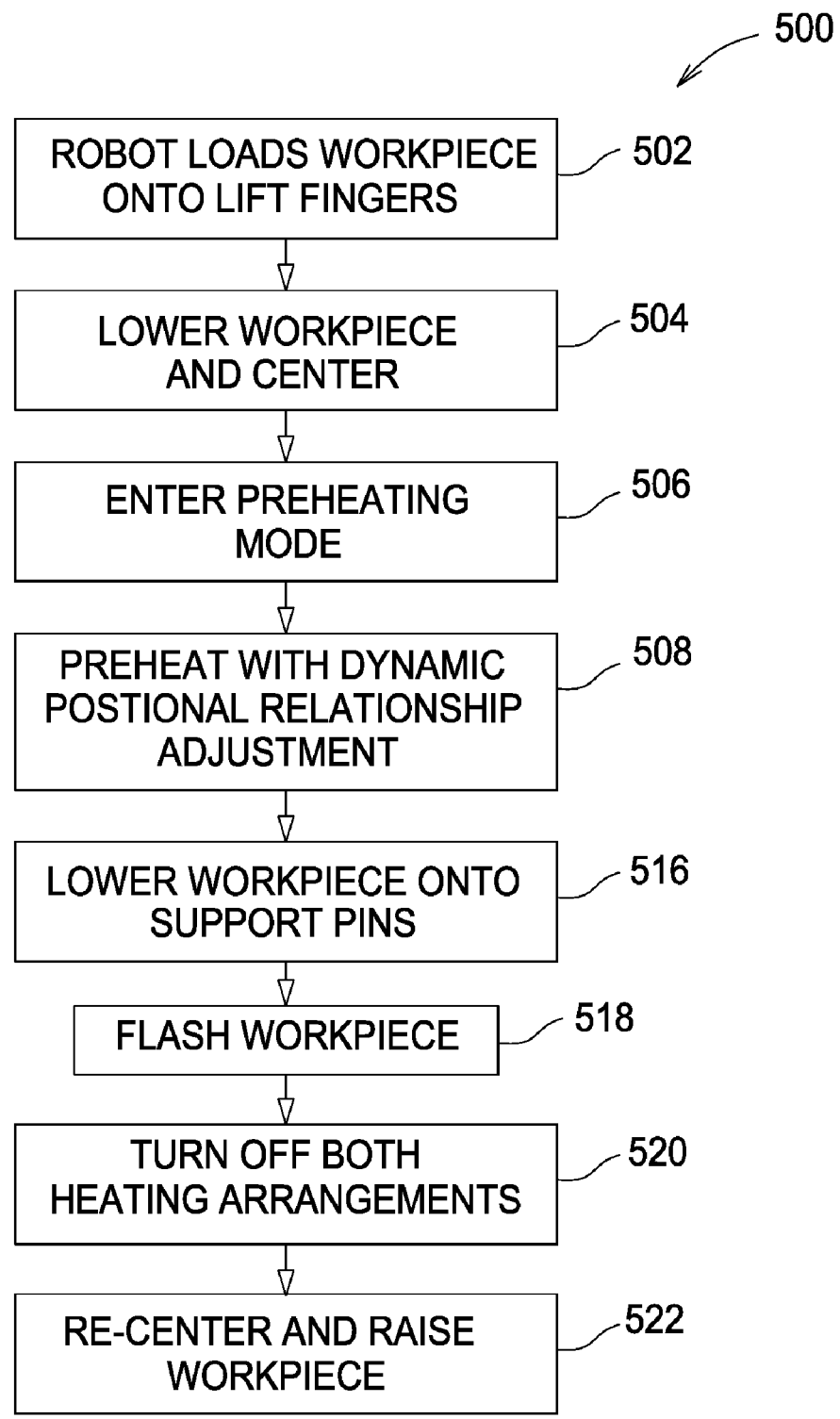
FIG. 10 is a flow diagram which illustrates a highly advantageous technique for thermally treating a workpiece in accordance with the present invention.

Having described FIGS. 1–9 in detail above, attention is now directed to a highly advantageous workpiece thermal processing technique that is shown in FIG. 10 and generally indicated by the reference number 500. At 502, a workpiece is moved into chamber 12a of FIG. 1 and placed on lifting fingers 440. The workpiece is then lowered at 504 and centered between centering fingers 420. In this regard, it is not required to fully withdraw centering fingers 420, once the workpiece has been positioned therebetween, since the workpiece can thereafter be lifted directly from the centered position.

At 506, a preheating mode is entered by initially raising the workpiece from its centered position using manipulation modules 400. In this regard, it is important to understand that process uniformity is enhanced, through the use of manipulation modules 400, since the workpiece is always centered prior to lifting. Thus, components such as, for example, reflector arrangement 140 can be optimized on the basis of the workpiece being within some quite limited lateral tolerance from a centered position. It is thereby assured that energy that is reflected by reflector arrangement 140 is incident in a desired way on the peripheral edge configuration of the workpiece.

At 508, the workpiece is moved dynamically by manipulation modules 400, during a preheating interval, so as to achieve uniform heating of the workpiece across its lateral extents. That is, workpiece 14 is moved in a way which dynamically changes the relative positional relationship between it and reflector arrangement 140 of FIG. 2a, so as to selectively heat the peripheral edge configuration of the workpiece in relation to the rest of the workpiece. In this regard, it should be appreciated that there must be a variation in the width of the peripheral edge region of the workpiece that is heated (in the present example, a radial variation) as a function of the positional relationship. It is recognized, as part of this highly advantageous technique, that dynamic adjustment of the positional relationship is appropriate, since the thermal conduction time of the workpiece is generally short in comparison to the duration of the heating interval. Temperature variation across the lateral extents of the workpiece can be monitored as described above. FIG. 9 diagrammatically illustrates an overall lateral preheating irradiance profile 510, shown as array of arrows having a length that corresponds to the total irradiance intensity at a given radial position on the workpiece such that the peripheral edge region receives an increased intensity. The irradiance intensity arrows are illustrated as normal to and directed toward backside 18 of the workpiece for purposes of illustrative simplicity, although this is understood not to be the case in view of the descriptions above. Further, workpiece 14 is shown in phantom, using dashed lines, at a flash heating position, supported by support pins 102 (one of which can be seen). It is noted that support pin 102 can be positioned to best accommodate bowing of the workpiece responsive to flash movement, as described in above incorporated U.S. patent application Ser. No. 11/018,388, since pre-heating is performed without a need to support the workpiece on support pins 102. The workpiece can be positioned above support pins 102 so there is no thermal contact between the pins and work piece during preheating. Therefore, support pins 102 do not create a thermal shadow which would affect the device area of the workpiece. The flash heating position is adjacent to a vertical range of positions 512, indicated by an double-headed arrow, such that movement of the workpiece within positional range 512 produces a varying peripheral edge region irradiance 514 that is indicated using another double-headed arrow.

The highly advantageous dynamic preheating technique disclosed herein can readily account for gradual heating of system components over a production run. One such component, discussed in relation to FIG. 2a, is window 100. For example, considering this window in the form of a fused silica plate, conductive and radiative transfer from the bottom and edge of a hot workpiece to the cold window will heat the window. During a production run, many workpieces will be processed and a radial temperature gradient will be created in the window, with the center hotter than the edge. This gradient will likely increase during the production run, as the window continues to heat up. Accordingly, effective compensation for this alternative source of radial temperature gradient is also provided by the present invention. That is, the aforedescribed dynamic, real-time temperature measurement and feedback will detect the edge cooling and the relative vertical positional relationship can be adjusted, irrespective of the specific mechanism that causes the radial temperature gradient, even during the course of a production run, to vary edge irradiance and heat the workpiece edge to obtain more uniform process results from one workpiece to the next.

Still considering preheating step 508, it should be mentioned that preheating while the workpiece is raised and supported by lifting end 490 of lifting arms 440 is advantageous for other reasons. For example, when workpiece 14 is supported by support pins 102 of FIG. 2a during preheating, a "cold spot" is produced proximate to the support pins. Heating while the workpiece is raised avoids the creation of a cold spot proximate to support pins 102.

At the same time, lifting end 490 of lifting arms 440 can advantageously be configured to project under the workpiece in a very limited way, as illustrated by FIG. 8b, since the centered position of the workpiece is readily maintained using manipulation modules 400 to within centering tolerance 493. That is, with the advent of an automated centering arrangement, there is no need to elongate lifting ends 490, in order to compensate for potential thermally induced or other movement of the workpiece responsive to processing. Limiting the length of lifting ends 490 is also advantageous with respect to the fact that they also can create a cold spot, proximate to the peripheral edge of the workpiece. Since there is never a need to lift an off-center workpiece, lifting ends 490 can have a length that is based on centering tolerance 493, rather than anticipated and unpredictable process induced movement within or even greater than lateral movement range 499. Further, any cold spot that is produced by lifting ends 490 is generally not of concern, since it becomes part of margin 497, outside of the useful device area, that is already discarded as a result of other, overriding process concerns. In the present example, lifting ends 490 include a length of approximately 1.5 mm, projecting beyond centering finger 420 in the illustration of FIG. 8b, while centering tolerance 493 is approximately 1 mm so as to insure lifting the workpiece reliably. Thus, lifting ends 490 extend no more than approximately 0.5 mm beneath the workpiece. In contrast, Applicants have observed lateral movements of a workpiece, responsive to flash heating, of 5 mm or more. Accordingly, without the use of the centering feature of manipulation modules 400, lifting ends 490 would have to extend more than 5 mm underneath the workpiece. Since the device area may be approximately 3 mm from the edge of the workpiece, 5 mm is well within the lateral extents of the device area on the opposite side of the workpiece and is likely to create a corresponding cold spot which will adversely influence device characteristics in that region. In the present example, a lifting range from approximately 0 mm to 15 mm is provided with a capability to center a workpiece that is at least 7 mm off center.

In a prior art system, such movement can lead to attempting to lift an off-center workpiece and, subsequently, dropping the workpiece. Thus, a prior art lifting arrangement must reach far enough under the workpiece, a much as even 1 cm, so as to compensate for potential movement of the workpiece. A competing problem is created, however, insofar as the prior art lifting arrangement may then produce a shadow or cold spot which extends into the device area of the workpiece. The use of manipulation modules 400, with automatic workpiece centering, serves to sweep aside these concerns in a highly advantageous and heretofore unseen way.

Continuing with a description of process 500, at 516 workpiece 14 is lowered onto support pins 102 (FIGS. 1 and 2) into its centered position. This movement can readily be accomplished before the workpiece experiences significant cooling, for example, if the preheating arrangement is turned off at some early point in relation to executing this movement. Thereafter, manipulation modules 400 are moved to the fully retracted position of FIG. 7. In this way, lifting arm 440 and centering finger 420 will not interfere with subsequent thermally induced movement of the workpiece during a flash heating mode. In 518, irradiance flash 30 is applied using flash heating arrangement 22. It is noted that support pins 102 do not produce a cold spot with respect to flash irradiance 30 since the flash duration is significantly shorter than the thermal conduction time of the workpiece. Moreover, the cooler bulk of the workpiece is relied upon as a heat sink for purposes of conducting the flash energy away from device side 16 of the workpiece and any effect, produced by the support pins, would be minimal because the bulk of the workpiece has already sufficiently dissipated the flash energy, in terms of influencing process results, prior to its reaching support pins 102. Further, even if the support pins were of some sort of concern with respect to flash irradiance 30, both preheating arrangement 20, if still on, and flash heating arrangement 22 can immediately be turned off at 520 and workpiece 14 can automatically be re-centered and then immediately raised at 522 using manipulation modules 400.

Referring briefly to FIG. 10, technique 500 is considered to be highly advantageous with respect to recognizing that handling a workpiece during a preheating interval can be performed in a dynamic way for purposes of enhancing temperature uniformity across the lateral extents of the workpiece, during which preheating interval, edge cooling is of concern. Further, during flash heating, which is essentially instantaneous, at least from a practical standpoint, the workpiece can being handled in a completely different way which essentially disregards the temperature uniformity constraints that are imposed by the preheating interval and shifts process concerns to other factors such as, for example, accommodating thermally induced movement of the workpiece.

It is to be understood that at least the following concepts are considered to be enabled by the foregoing description.

What is claimed is:

1. A method for thermal processing of at least one wafer-shaped workpiece having opposing first and second major surfaces surrounded by a peripheral edge which defines a workpiece diameter such that the first and second opposing surfaces cooperate with said peripheral edge to define a peripheral edge region, said method comprising:

moving the workpiece into a chamber interior that is defined by a processing chamber;

using a heating arrangement in thermal communication with said chamber interior and in a confronting relationship with said first major surface for emitting an illumination energy such that a first portion of the illumination energy is directly incident upon said first major surface of the workpiece and a second portion of the illumination energy is directed so that, at least initially, the second portion would miss the first major surface; and reflecting at least some of said second portion of the illumination energy onto the peripheral edge region of said workpiece using a reflector that is supported in said chamber interior having an at least generally annular configuration thereby defining a central opening with an opening width, for any given measurement thereof, that is greater than said workpiece diameter, and said reflector is arranged, at least generally, in a concentric relationship with said peripheral edge.

2. A method for heat treating at least one generally planar workpiece having opposing first and second major surfaces surrounded by a peripheral edge configuration such that the first and second opposing surfaces cooperate with said peripheral edge configuration to define a peripheral edge region, said method comprising:

moving the workpiece into a chamber interior that is defined by a processing chamber;

using a heating arrangement in thermal communication with said chamber interior and in a confronting relationship with said first major surface for emitting an illumination energy such that a first portion of the illumination energy is directly incident upon said first major surface of the workpiece and a second portion of the illumination energy is directed so that, at least initially, the second portion would miss the first major surface; and reflecting at least part of said second portion of the illumination energy, using a complementary reflector configuration that forms part of a reflector arrangement supported in the chamber interior to, thereafter, be incident around and onto the peripheral edge region of said workpiece, and configuring said complementary reflector configuration to have a shape that is aligned with the peripheral edge configuration of the workpiece in a spaced-apart relationship therewith such that a projection of at least the complementary reflector configuration onto a plane which includes the first major surface is complementary to and outwardly spaced away from said peripheral edge configuration by at least a predetermined distance.

3. The method of claim 2 wherein said predetermined distance is approximately 3 mm.

4. The method of claim 2 including configuring said reflector arrangement to substantially limit reflector absorption of the second portion of illumination energy such that a pre-illumination temperature of the reflector arrangement is substantially maintained, irrespective of incidence of said second portion of said illumination energy.

5. The method of claim 2 wherein a projection of the reflector arrangement onto said plane which includes the first major surface is complementary to and outwardly spaced away from said peripheral edge configuration by at least said predetermined distance.

6. The method of claim 2 including configuring said complementary reflector configuration such that any given position on the complementary reflector configuration is no more than approximately 15 mm from a nearest point on said workpiece.

7. The method of claim 2 including configuring said reflector arrangement such that any given position on said reflector arrangement is spaced away from a nearest position on an outermost edge of said workpiece such that an angle defined between a first line passing through said nearest position on the outermost edge and at least generally normal to said first major surface, and a second line, defined between the given position on the reflector arrangement and the nearest position on the outermost edge of the workpiece, is greater than approximately 45 degrees.

8. The method of claim 7 wherein said angle is formed to be greater than approximately 60 degrees.

9. The method of claim 2 including configuring said complementary reflector configuration to form substantially an only portion of the reflector arrangement that faces said workpiece.

10. The method of claim 2 including configuring said complementary reflector configuration with a plurality of reflector segments that are spaced apart therearound at least for reducing an overall intensity of the part of the second portion of illumination energy that is incident upon the peripheral edge region of the workpiece.

11. The method of claim 10 including separating adjacent ones of said reflector segments by a cut-away region of the reflector arrangement such that some of the second portion of illumination energy passes uninfluenced through the cut-away region.

12. The method of claim 2 including integrally forming said reflector arrangement from a quartz plate.

13. The method of claim 2 including forming said complementary reflector configuration to include a frusto-conical shape.

14. The method of claim 2 wherein said workpiece is an at least generally circular wafer and including configuring said complementary reflector configuration to be at least generally circular and as a surface of rotation of a line having a second order of curvature.

15. The method of claim 2 including moving a selected one of said reflector arrangement and said workpiece for in a direction that is at least generally normal to said first major surface for use in varying said part of the second portion of the illumination energy that is incident on the peripheral edge region of the workpiece.

16. The method of claim 15 including causing said reflector arrangement to cooperate with said movement such that the second portion of illumination energy is incident on a peripheral band of the peripheral edge region having an illumination width that varies responsive to said movement.

17. The method of claim 16 including moving the reflector arrangement to vary, using a reflector actuator mechanism, said part of the second portion of the illumination energy.

18. The method of claim 17 including locating said reflector actuator mechanism in said chamber interior, proximate to the reflector arrangement.

19. The method of claim 15 including using a pulsed energy source, as part of said heating arrangement, in a confronting relationship with the second major surface of said workpiece for emitting a pulsed energy to substantially instantaneously heat the second major surface in a flash heating mode, in cooperation with heating said first major surface using said illumination energy during a pre-heating interval, having a duration which provides for using said movement to change at least one characteristic of the part of the second portion of the illumination energy that is incident on the peripheral edge region during the pre-heating interval.

20. The method of claim 19 wherein said one characteristic is a width of the part of the second portion of the illumination energy that is incident upon the peripheral edge region.

21. The method of claim 19 wherein the workpiece includes a configuration of lateral extents and including moving the selected one of the workpiece and the reflector arrangement, using a manipulation arrangement, for use in enhancing heating uniformity across the configuration of lateral extents of the workpiece during said pre-heating interval and further moving the workpiece to a flash heating position at a flash heating station for receiving said pulsed energy in said flash heating mode and wherein said reflector arrangement, with the workpiece at the flash heating position, is configured to provide for a substantially shadow-free illumination of the second major surface of the workpiece by said pulsed energy.

22. The method of claim 21 wherein moving the workpiece is performed, using the manipulation arrangement, in a pre-heating positional range for use in enhancing heating uniformity across the lateral extents of the workpiece during the pre-heating interval.

23. The method of claim 22 wherein said flash heating position places said workpiece farther from said pulsed energy source than said pre-heating positional range.

24. The method of claim 22 including using said reflector arrangement to cooperate with said movement in said pre-heating positional range to cause said part of the second portion of illumination energy to be incident on a peripheral band of the peripheral edge region having an illumination width that varies responsive to said movement.

25. The method of claim 22 wherein the workpiece, at least potentially and responsive to the pulsed energy, can move to an offset position from the flash heating position at the flash heating station and configuring said manipulation arrangement for movement (i) in a centering mode, with the substrate located at said flash heating station, between a disengaged position, that is withdrawn from said peripheral edge configuration of the workpiece by a predetermined distance, and an engaged position for use in engaging said peripheral edge configuration such that movement from the disengaged position to the engaged position causes the workpiece to move from said offset position to within a centering tolerance from said flash heating position and (ii) for movement in a lifting mode to elevationally move the workpiece between the flash heating station and pre-heating positional range above the treatment station.

26. The method of claim 25 including raising said workpiece, using said manipulation arrangement in the lifting mode, from the flash heating station with the workpiece, at least initially, within said centering tolerance from the flash heating position.

27. The method of claim 25 including lowering the workpiece from the elevated position to the flash heating station in the lifting mode, using said manipulation arrangement and, thereafter, releasing the workpiece within said centering tolerance from the flash heating position in moving from the engaged position to the disengaged position in the centering mode.

28. The method of claim 2 wherein said workpiece is wafer-shaped having a workpiece diameter that is delimited by a peripheral edge to define said peripheral edge configuration and including configuring said reflector arrangement to include an at least generally annular configuration, thereby defining a central opening with an opening width, for any given measurement thereof, that is greater than said workpiece diameter, and positioning said reflector arrangement, at least generally, in a concentric relationship with said peripheral edge, for reflecting at least said part of the second portion of the illumination energy onto the peripheral edge region of said workpiece.

29. The method of claim 2 including arranging said reflector arrangement to include a first reflector defining a first subpart of said complementary reflector configuration and a second reflector defining a second subpart of said complementary reflector configuration and spacing the first reflector apart in relation to the second reflector and in alignment with the peripheral edge configuration of the workpiece to cooperatively reflect said part of the second portion of the illumination energy.

30. The method of claim 29 including supporting the workpiece on a support plate such that the first portion of the illumination energy passes through said support plate to reach the workpiece and positioning the first reflector on an opposite side of the support plate with respect to the second reflector.

31. A method for heat treating at least one wafer-shaped workpiece having opposing first and second major surfaces delimited by a peripheral edge, said method comprising:

moving the workpiece into a chamber interior that is defined by a processing chamber;

using a first heating arrangement in thermal communication with said chamber interior for emitting a first illumination energy in a confronting relationship with said first major surface during a first heating mode, at least a first portion of which first illumination energy is directly incident on said first major surface;

in cooperation with emitting said first illumination energy, using a second heating arrangement, in thermal communication with said chamber interior and in a confronting relationship with said second major surface, for emitting a second illumination energy, during a second heating mode, that is directly incident on said second major surface; and reflecting a second portion of said first illumination energy, that would otherwise at least initially miss the first major surface, using a reflector that is supported in said chamber interior having an annular reflector configuration, so as to be surroundingly incident on a peripheral edge region of said workpiece, proximate to the peripheral edge, and providing for a substantially shadow-free illumination of said second major surface by said second illumination energy at least during said second heating mode.

32. A method for heat treating at least one wafer-shaped workpiece having opposing first and second major surfaces surrounded by a peripheral edge, said method comprising:

moving the workpiece into a chamber interior that is defined by a processing chamber;

using a first heating arrangement in thermal communication with said chamber interior for emitting a first illumination energy in a confronting relationship with said first major surface during a first heating mode, a first portion of which first illumination energy is directly incident on said first major surface and a second portion of which, at least initially, would miss the first major surface;

in cooperation with emitting said first illumination energy, using a second heating arrangement, in thermal communication with said chamber interior and in a confronting relationship with said second major surface, for emitting a second illumination energy, during a second heating mode, that is directly incident on said second major surface; and reflecting at least some of said first illumination energy around and onto the peripheral edge region of said workpiece using a reflector arrangement, supported in said chamber interior, having an overall shape that is complementary with respect to the peripheral edge configuration of said workpiece so as to define a complementary reflector configuration with said reflector arrangement and said workpiece mutually supported in a way which aligns the complementary reflector configuration with the peripheral edge configuration of said workpiece in a spaced-apart relationship therewith and to cooperatively provide for substantially shadow-free illumination of said second major surface by said second illumination energy, at least during said second heating mode.

33. A method for heat treating at least one substrate having opposing first and second major surfaces which define a configuration of lateral extents of the substrate that is delimited by a peripheral edge configuration, said method comprising:

moving the substrate into a chamber interior that is defined by a processing chamber;

emitting a pre-heating irradiance into said chamber interior, using a first heating configuration, for use in inducing a bulk temperature rise of said workpiece progressively during a preheating interval such that changing a relative positional relationship, between the substrate and the first heating configuration, changes an intensity profile of the pre-heating irradiance across the lateral extents of the substrate;

elevationally moving said substrate during said preheating interval, using a manipulation arrangement, to change the intensity profile of the pre-heating irradiance across the lateral extents of the substrate in a way which enhances uniformity of said bulk temperature increase across the configuration of lateral extents of the substrate and for moving the substrate to a treatment position at a treatment station for exposure to a flash irradiance; and emitting said flash irradiance, using a second heating configuration, to produce a substantially instantaneous increase in a surface temperature of a selected one of said first and second major surfaces of the substrate.

\* \* \* \* \*